United States Patent
Suzuki et al.

(10) Patent No.: US 7,148,125 B2
(45) Date of Patent: Dec. 12, 2006

(54) METHOD FOR MANUFACTURING SEMICONDUCTOR POWER DEVICE

(75) Inventors: Mikimasa Suzuki, Toyohashi (JP); Chikage Noritake, Ama-gun (JP)

(73) Assignee: Denso Corporation, Kariya (JP)

( * ) Notice: Subject to any disclaimer, the term of this patent is extended or adjusted under 35 U.S.C. 154(b) by 291 days.

(21) Appl. No.: 10/310,021

(22) Filed: Dec. 5, 2002

(65) Prior Publication Data

US 2003/0119281 A1 Jun. 26, 2003

(30) Foreign Application Priority Data

Dec. 12, 2001 (JP) ............... 2001-378725
Apr. 9, 2002 (JP) ............... 2002-106327
Sep. 10, 2002 (JP) ............... 2002-264135

(51) Int. Cl.
*H01L 21/46* (2006.01)
*H01L 21/302* (2006.01)

(52) U.S. Cl. ............ 438/459; 438/464; 438/690
(58) Field of Classification Search ............ 438/459, 438/460, 977, 455, 458, 689, 694
See application file for complete search history.

(56) References Cited

U.S. PATENT DOCUMENTS

| | | | |
|---|---|---|---|
| 4,898,804 A * | 2/1990 | Rauschenbach et al. | 430/311 |
| 4,978,421 A * | 12/1990 | Bassous et al. | 216/2 |
| 5,242,862 A | 9/1993 | Okabe et al. | |
| 5,324,410 A * | 6/1994 | Kummer et al. | 204/297.05 |
| 5,393,711 A * | 2/1995 | Biallas et al. | 438/458 |
| 5,807,783 A * | 9/1998 | Gaul et al. | 438/406 |
| 5,874,365 A | 2/1999 | Tomita et al. | |
| 6,124,179 A * | 9/2000 | Adamic, Jr. | 438/309 |
| 6,162,702 A * | 12/2000 | Morcom et al. | 438/459 |
| 6,251,542 B1 * | 6/2001 | Tomita et al. | 430/5 |
| 6,277,659 B1 * | 8/2001 | Goruganthu et al. | 438/14 |
| 6,436,229 B1 * | 8/2002 | Tai et al. | 257/E21.218 |

(Continued)

FOREIGN PATENT DOCUMENTS

JP A-H05-121384 5/1993

(Continued)

OTHER PUBLICATIONS

Office Action from the Japenese Patent Office in Japanese application No. 2002-264135 which is a counterpart Japanese application of U.S. Appl. No. 10/310,021 (English translation attached) mailed on Aug. 3, 2004. Cited Reference: Cited Reference: JP-B2-2513055 corresponds to US 5,242,862 which was disclosed in the IDS submitted on Dec. 5, 2002. JP-A-2000-124166 was disclosed on Dec. 5, 2002.

(Continued)

*Primary Examiner*—Carl Whitehead, Jr.
*Assistant Examiner*—James M. Mitchell
(74) *Attorney, Agent, or Firm*—Posz Law Group, PLC

(57) ABSTRACT

A semiconductor device, which has a relatively low ON resistance, is manufactured using the following steps. First, a semiconductor wafer that includes a semiconductor layer and a semiconductor element layer, which is located on the semiconductor layer, is formed. Then, the wafer is ground evenly to a predetermined thickness from the side where the semiconductor layer is located. Next, the wafer is etched to a predetermined thickness from the side where the semiconductor layer is located while the periphery of the wafer is masked against the etchant to form a rim at the periphery. The wafer is reinforced by the rim at the periphery, so even if the wafer is relatively large, the wafer is prevented from breaking or warping at the later steps after the wafer is thinned by etching.

11 Claims, 20 Drawing Sheets

U.S. PATENT DOCUMENTS

| | | | |
|---|---|---|---|
| 6,475,889 B1 * | 11/2002 | Ring | 438/571 |
| 6,492,195 B1 * | 12/2002 | Nakanishi et al. | 438/106 |
| 6,541,388 B1 * | 4/2003 | Saito | 438/712 |
| 6,551,851 B1 * | 4/2003 | Gamble et al. | 438/53 |
| 6,746,938 B1 * | 6/2004 | Uchiyama et al. | 438/459 |
| 6,787,394 B1 * | 9/2004 | Farnworth | 438/114 |
| 6,844,623 B1 * | 1/2005 | Peterson et al. | 257/723 |
| 2001/0029060 A1 * | 10/2001 | Fukada et al. | 438/50 |
| 2002/0019084 A1 * | 2/2002 | Francis et al. | 438/197 |
| 2003/0099907 A1 * | 5/2003 | Tei et al. | 430/313 |

FOREIGN PATENT DOCUMENTS

| | | |
|---|---|---|
| JP | A-7-130703 | 5/1995 |
| JP | A-H11-176800 | 7/1999 |
| JP | A-H11-186215 | 7/1999 |
| JP | A-H11-191550 | 7/1999 |
| JP | A-2000-91307 | 3/2000 |
| JP | A-2000-124166 | 4/2000 |
| JP | A-2000-277483 | 10/2000 |
| JP | A-2001-144074 | 5/2001 |

OTHER PUBLICATIONS

Office Action from the Chinese Patent Office in Chinese application No. 02155731.4 which is a counterpart application of U.S. Appl. No. 10/310,021(English translation attached) mailed on May 13, 2005. Cited Reference: JP-A-2000-124166 was disclosed in IDS flied on Dec. 5, 2002.

* cited by examiner

FIG. 7A
FIG. 7B
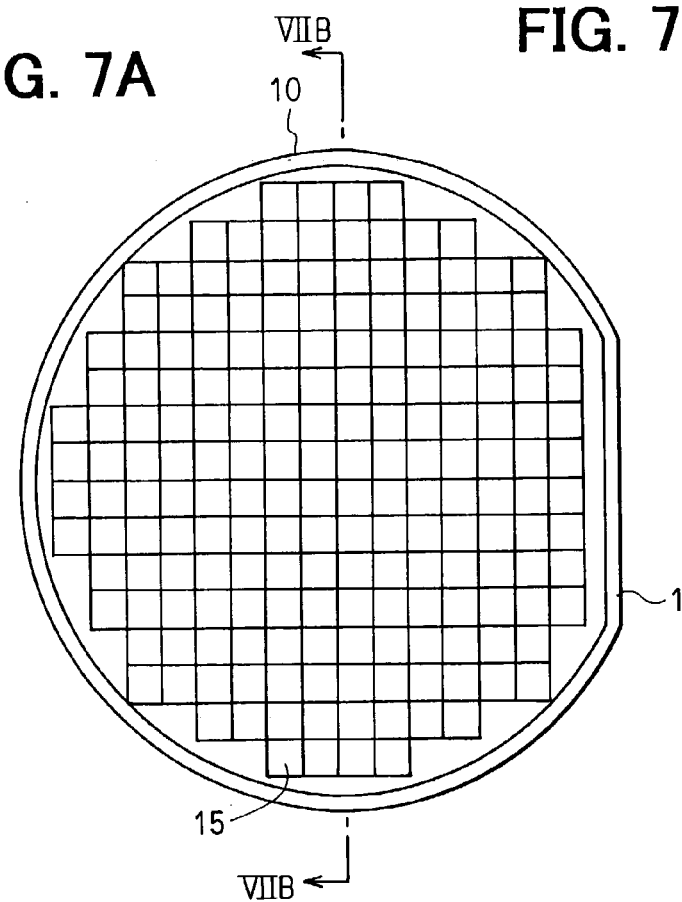
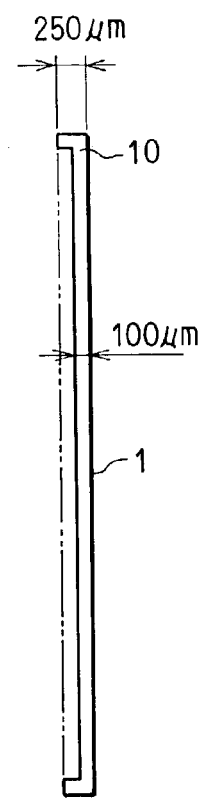
FIG. 8
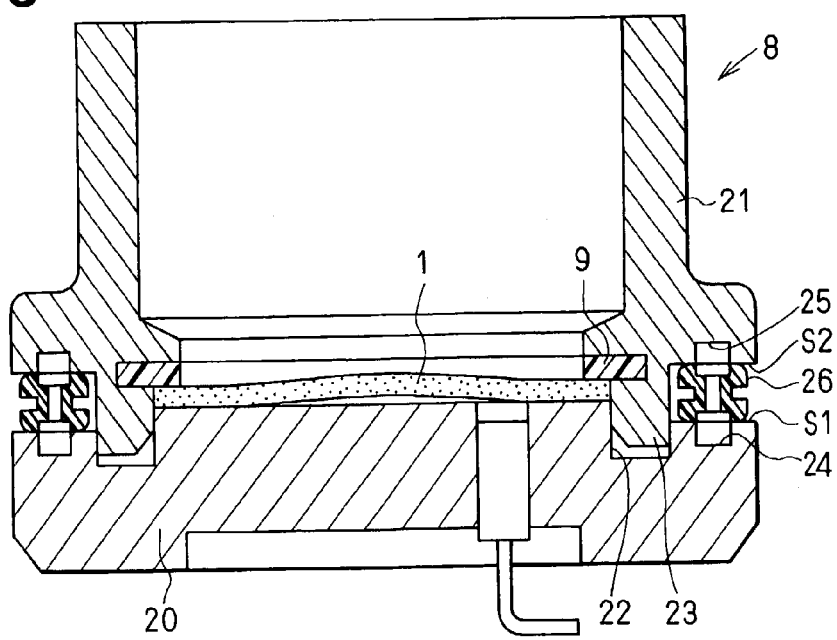

BEFORE GRINDING

625 μm

AFTER GRINDING

250 μm

AFTER GRINDING

METHOD FOR MANUFACTURING SEMICONDUCTOR POWER DEVICE

CROSS REFERENCE TO RELATED APPLICATION

This application is based on and incorporates herein by reference Japanese Patent Applications No. 2001-378725 filed on Dec. 12, 2001, No. 2002-106327 filed on Apr. 9, 2002, and No. 2002-264135 filed on Sep. 10, 2002.

BACKGROUND OF THE INVENTION

The present invention relates to a method for manufacturing a semiconductor power device. With the method, the ON resistance of the device is improved.

A variety of methods have been proposed to reduce the ON resistance of a power device. In the methods, the resistance of the semiconductor layer included in the device is decreased. For example, JP-B-2513055, corresponding U.S. Pat. No. 5,242,862, of which is discloses a method for manufacturing a vertical semiconductor power device. The method includes the following steps. At first, a device layer, which includes MOSFETs, and a front surface electrode are formed on the front surface of a semiconductor wafer. Then, the wafer is evenly ground from back surface, which is opposite to the front surface, such that the wafer has a thickness of 200 to 450 μm. Next, a back surface electrode is formed on the back surface of the wafer. The semiconductor layer included in the power device is thinned by the grinding, so the resistance of the semiconductor layer is decreased. As a result, the ON resistance of the power device is reduced.

However, with the method according to the publication, the fragility of the wafer increases drastically if the wafer is ground to thinner than 200 μm. As a result, the yield of the power device is lowered due to the wafer breakage during the grinding or when an adhesive film that is stuck to the wafer is peeled from the wafer. Therefore, it is substantially impossible to make the wafer thinner than 200 μm by the method according to the publication. That is, it is substantially impossible to drastically reduce the ON resistance of the power device by the method according to the publication.

On the other hand, JP-A-5-121384 discloses a method, with which the above problem can be solved. In the method, a semiconductor wafer is thinned only at its central area from the back surface using a polishing machine, which includes a grindstone having a diameter smaller than that of the wafer, and a rim is formed at the periphery of the wafer after polishing. The wafer is not thinned in the periphery, so the rim has the original thickness of the wafer to reinforce the wafer. Therefore, it is possible to make the wafer thinner than 200 μm.

However, with the method disclosed in JP-A-5-121384, the wafer is damaged at its polished back surface. Accordingly, the contact resistance between the back surface and a back surface electrode, which is formed on the back surface, is relatively high. In addition, it is substantially impossible to form a beam in the central area for reinforcing the central area because the wafer is polished with the grindstone, which has a diameter smaller than that of the wafer. As a result, if a wafer having a relatively large diameter needs to be polished, the wafer may break or warp. Therefore, in that case, the method disclosed in JP-A-5-121384 is less effective.

SUMMARY OF THE INVENTION

The present invention has been made in view of the above aspect with an object to provide a method for manufacturing a semiconductor device having relatively low ON resistance while the wafer used for the manufacturing is prevented from breaking or warping even if the wafer has a relatively large diameter.

In the present invention, a semiconductor device, in which a semiconductor element layer is located on a semiconductor layer, is manufactured using the following steps. First, a semiconductor wafer that includes a semiconductor layer and a semiconductor element layer, which is located on the semiconductor layer, is formed. The wafer has a first surface, at the side of which the semiconductor element layer is located. The wafer has a second surface, which is opposite to the first surface, and at the side of which the semiconductor layer is located. Then, the wafer is ground evenly from the second surface to a predetermined thickness. Next, the wafer is etched to a predetermined thickness from the second surface while the periphery of the wafer is masked against the etchant to form a rim at the periphery.

Alternatively, a semiconductor device, in which a semiconductor element layer is located on a semiconductor layer that has a relatively low impurity concentration, is manufactured using the following steps. First, a semiconductor wafer that includes a semiconductor layer, which has a relatively low impurity concentration, and a semiconductor element layer, which is located on the semiconductor layer, is formed. The wafer has a first surface, at the side of which the semiconductor element layer is located. The wafer has a second surface, which is opposite to the first surface, and at the side of which the semiconductor layer is located. Then, the wafer is ground evenly from the second surface to a predetermined thickness. Next, the wafer is etched to a predetermined thickness from the second surface while the periphery of the wafer is masked against the etchant to form a rim at the periphery. Then, a high impurity concentration layer, which has an impurity concentration higher than the semiconductor layer, is formed at the second surface.

BRIEF DESCRIPTION OF THE DRAWINGS

The above and other objects, features and advantages of the present invention will become more apparent from the following detailed description made with reference to the accompanying drawings. In the drawings:

FIG. 7A is a schematic plan view of a semiconductor wafer after the wafer is separated into semiconductor chips, and FIG. 7B is a schematic cross-sectional view of the wafer taken along the line VIIB—VIIB;

FIG. 8 is a schematic cross-sectional view of an etching pot;

DETAILED DESCRIPTION OF THE PREFERRED EMBODIMENTS

The present invention will be described in detail with reference to various embodiments.

First Embodiment

Figure 1A:
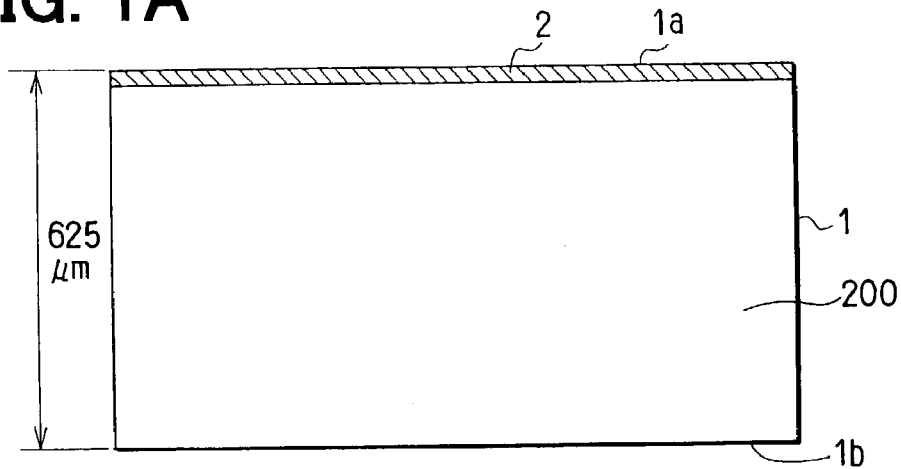
FIGS. 1A to 1D are schematic cross-sectional views showing manufacturing steps of a semiconductor power device using the method according to the first embodiment of the present invention.

As shown in FIG. 1A, a semiconductor wafer 1 includes a semiconductor layer 200, which is $n^+$-type or $p^+$-type and has a relatively high impurity concentration, and a semiconductor element layer 2, which is located on the semiconductor layer 200. The semiconductor element layer 2 includes semiconductor elements. The semiconductor wafer 1 has a first surface 1a, or a front surface 1a, and a second surface 1b, or a back surface 1b, which is opposite to the front surface 1a. The wafer 1 has a thickness of 625 μm.

Figure 1B:
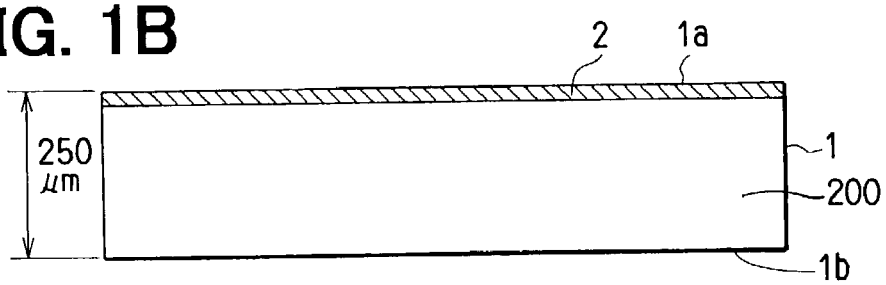
Figure 2:
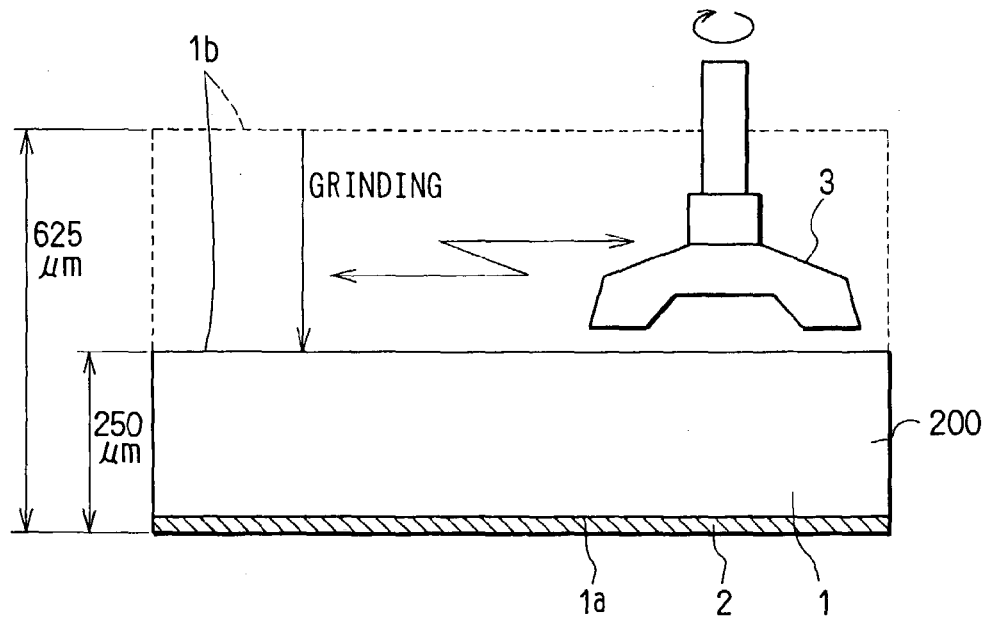
FIG. 2 is a schematic cross-sectional view showing a manufacturing step of the semiconductor power device using the method according to the first embodiment.
Figure 3:
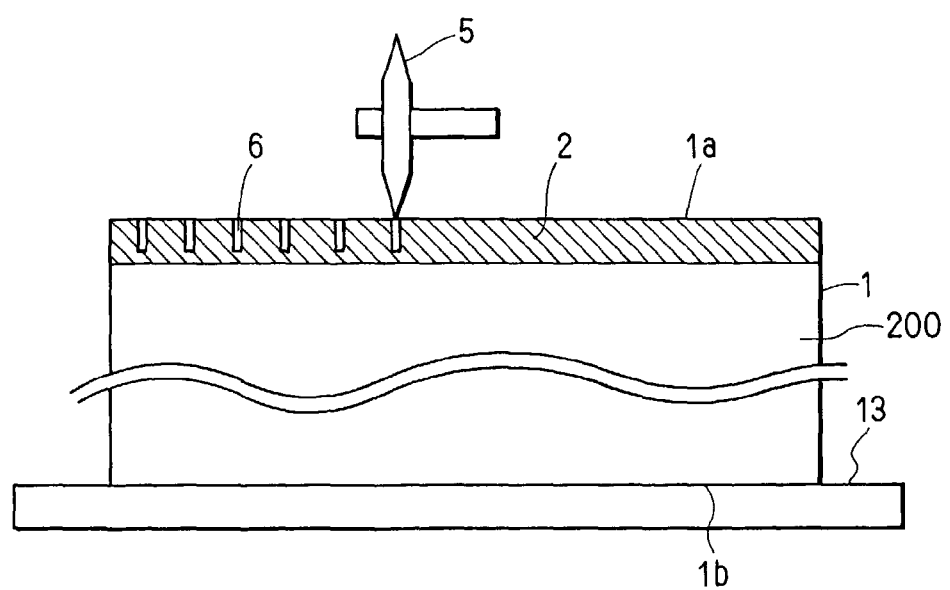
FIG. 3 is a schematic cross-sectional view showing a manufacturing step of the semiconductor power device using the method according to the first embodiment.

As shown in FIG. 2, the wafer 1 is evenly ground with a grindstone 3 from the back surface 1b such that the wafer 1 has a thickness of, for example, 250 μm. In the grinding, the entire back surface 1b is thinned to a determined thickness. After the grinding, the wafer 1 has a cross-sectional structure shown in FIG. 1B. Then, as shown in FIG. 3, an adhesive tape 13 is stuck on the back surface 1b, and a plurality of cutting grooves 6, each of which has a predetermined depth from the front surface 1a, are formed in the element layer 2 using a cutter 5.

Figure 1C:
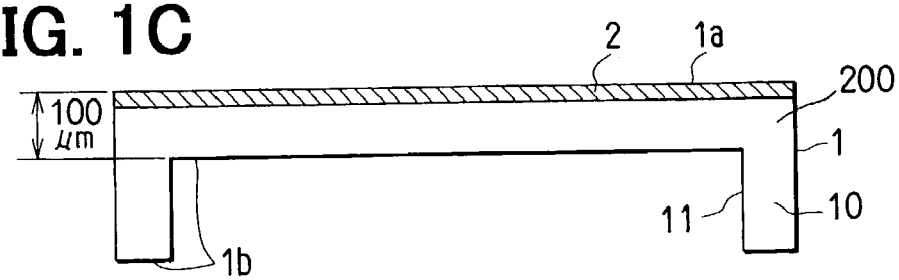
Figure 4:
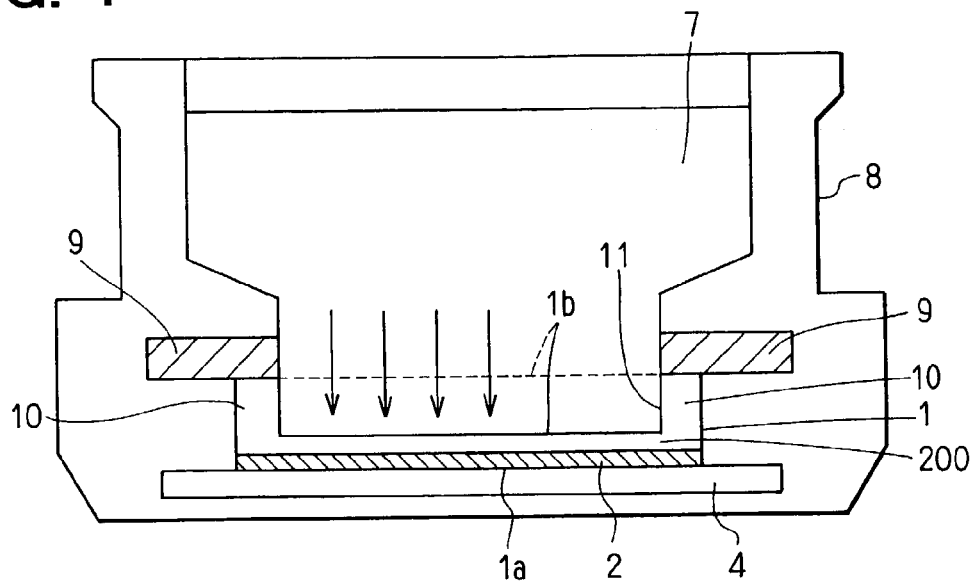
FIG. 4 is a schematic cross-sectional view showing a manufacturing step of the semiconductor power device using the method according to the first embodiment.

Next, as shown in FIG. 4, a protection member 4, or an adhesive tape 4, is stuck on the front surface 1a, and the wafer 1 is placed at a predetermined position in an etching pot 8 such that the back surface 1b is exposed to an etchant 7 during the etching of the wafer 1 except for the periphery of the back surface 1b, which is masked by a gasket 9. Then, the wafer 1 is etched from the back surface 1b by the etchant 7 until the thickness of the wafer 1 becomes 100 μm at the etched area. The thickness of the wafer 1 at the etched area is greater than the depth of the cutting grooves after the etching. With the etching, as shown in FIG. 1C, a rim 10 is formed at the periphery of the wafer 1 because the periphery is masked by the gasket 9 during the etching. At the same time, a recess 11, which is defined by the rim 10, is formed in the wafer 1.

Figure 1D:
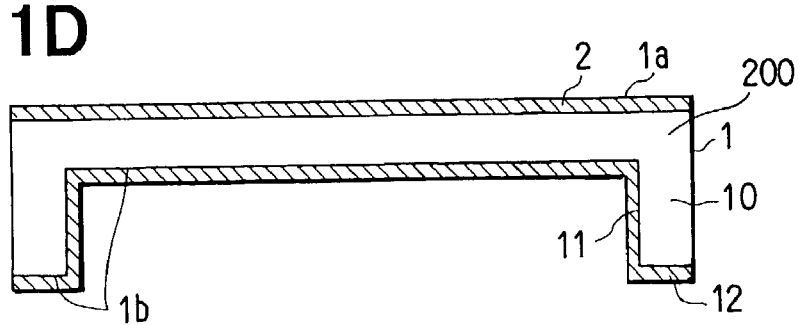
Figure 5:
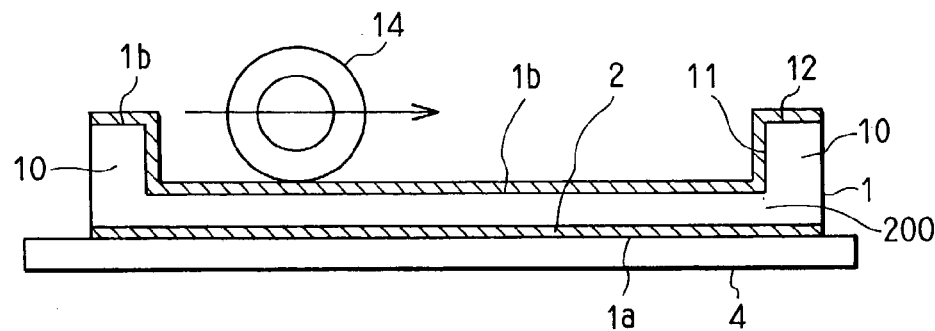
FIG. 5 is a schematic cross-sectional view showing a manufacturing step of the semiconductor power device using the method according to the first embodiment.
Figure 6:
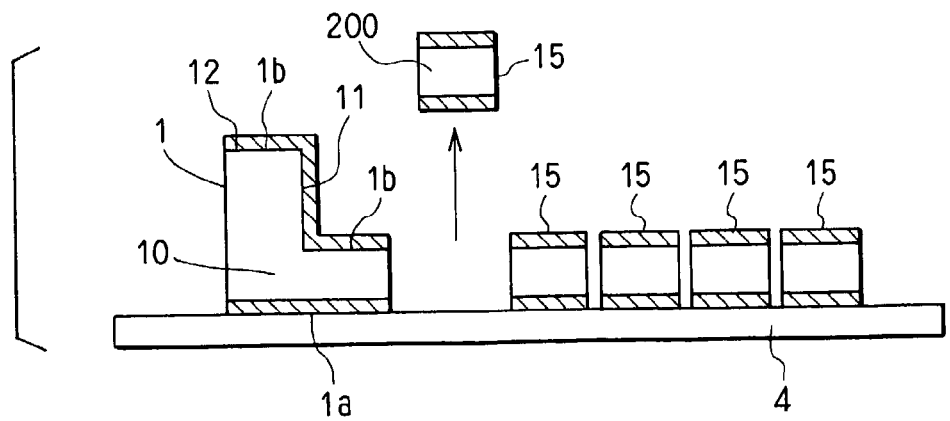
FIG. 6 is a schematic cross-sectional view showing a manufacturing step of the semiconductor power device using the method according to the first embodiment.

Subsequently, as shown in FIG. 1D, a back surface electrode 12, or a drain electrode 12, is formed on the entire back surface 1b by depositing a metal using vacuum evaporation, sputtering, CVD, and so on. Then, as shown in FIG. 5, the wafer 1 and the adhesive tape 4 are supported such that the front surface 1a faces downward, and the wafer 1 is pressed by a break roller 14 to bend. With the bending deformation, the wafer 1 breaks along the cutting grooves 6 and separates into a plurality of semiconductor devices 15, or semiconductor chips 15. Finally, as shown in FIG. 6, each chip 15 is picked up from the wafer 1 shown in FIG. 7 and mounted at a predetermined place.

The etching step schematically shown in FIG. 4 will be described in detail. As shown in FIG. 8, an etching pot 8 includes a plate-shaped pot base 20 and a cylinder-shaped pot ring 21. The wafer 1 is placed on top of the pot base 20, and the pot ring 21 is placed on top of the wafer 1 such that the wafer 1 closes the opening of the pot ring 21. The central area of the pot base 20 is a stage for holding the wafer 1. An annular recess 22 is located at the periphery of the pot base 20 around the stage. A projection 23 of the pot ring 21 fits into the annular recess 22. The annular recess 22 is used for aligning the pot ring 21. A lower seal surface S1, which is flat and in a ring shape, is located on the pot base 20 around the annular recess 22, as viewed in FIG. 8. An annular recess 24 is located in the lower seal surface S1 to function as a vacuum pocket.

An annular inner gasket 9 is fixed in the inner surface of the lower part of the pot ring 21. The inner gasket 9 prevents the etchant 7 from leaking out of an etching bath formed by the pot ring 21 and the wafer 1 mounted on the pot base 20.

Furthermore, an upper sealing surface S2, which is flat and in a ring shape, is located on a flange of the lower part of the pot ring 21, as viewed in FIG. 8. An annular recess 25 is located in the upper sealing surface S2 to function as a vacuum pocket. An annular outer gasket 26, which has an X-shaped cross section as shown in FIG. 8, is placed between the lower sealing surface S1 and the upper sealing surface S2. By pumping air out of the annular recesses 24, 25 using a vacuum pump, the outer gasket 26 is shrunken to fix the pot base 20 and the pot ring 21 while permitting the inner gasket 9 to seal a gap between the pot ring 21 and the wafer 1.

Figure 9:
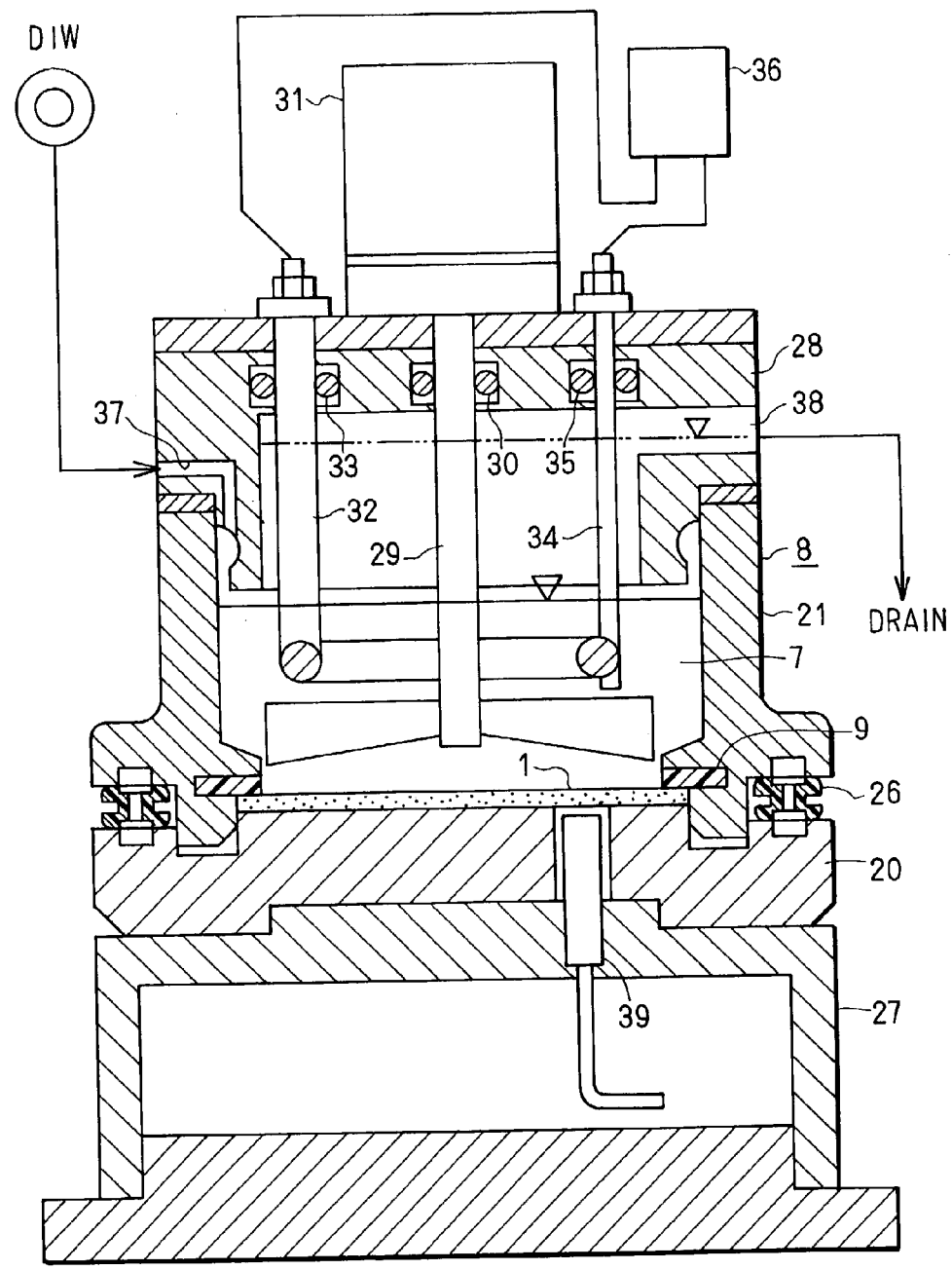
FIG. 9 is a schematic cross-sectional view of an etching apparatus.

The etching pot 8 of FIG. 8 is set in a pot etching system, as shown in FIG. 9. Then, the etchant 7 is supplied into the etching pot 8. The inner gasket 9 does not only seal the gap between the pot ring 21 and the wafer 1 against the etchant 7, but also masks the periphery of the wafer 1 from the etchant 7. Therefore, when the etching pot is filled with the etchant 7, the etchant 7 does not contact the periphery of the wafer 1 on the back surface 1b.

More specifically, the etching pot 8 is mounted on to a pot stage 27, and the upper opening of the etching pot 8 is plugged with a lid 28. A stirrer 29 is supported by the lid 28 while being sealed with a sealing material 30. The stirrer 29 is driven by a motor 31 to agitate the etchant 7. A heater 32 for heating the etchant 7 is also supported by the lid 28 while being sealed with a sealing material 33. A temperature sensor 34 for measuring the temperature of the etchant 7 is also supported by the lid 28 while being sealed with a sealing material 35. During the etching by the pot etching system in FIG. 9, the etchant 7 is continuously agitated by the stirrer 29, while the heater 32 is electrically controlled by a temperature controller 36 to keep the temperature of the etchant 7 at a predetermined temperature, which is sensed by the temperature sensor 34.

Figure 10:
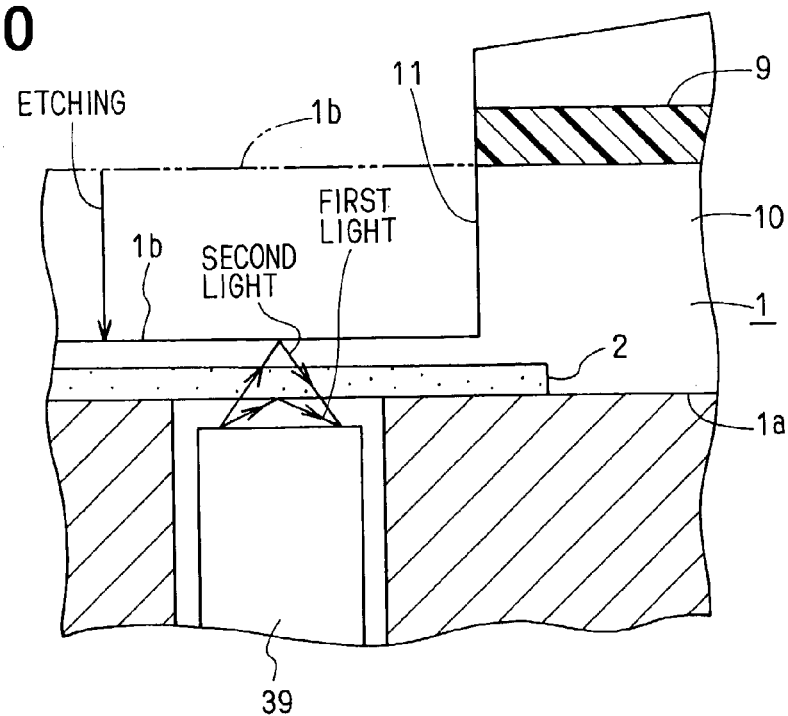
FIG. 10 is a partially enlarged cross-sectional view of the etching pot.

Furthermore, the lid 28 includes a passage 37 for deionized water (DIW), so deionized water can be supplied into the etching pot 8 falling down along the inner wall of the pot ring 21. The lid 28 also includes a drain opening 38 for draining out waste water by having the waste water overflow the etching pot 8. As shown in FIG. 9, the pot base 20 includes a thickness sensor 39 to measure the thickness of the wafer 1 at the bottom of the recess 11, and the progress of etching is monitored to detect the etching end point, as shown in FIG. 10. The thickness sensor 39 measures the thickness of the wafer 1 at the bottom of the recess 11 on the basis of the first light reflected on the front surface 1a and the second light reflected on the back surface 1b When a predetermined thickness is etched off and the thickness of the wafer 1 at the bottom of the recess 11 becomes a predetermined thickness, deionized water is supplied into the etching pot 8 through the passage 37 to dilute and cool off the etchant 7 and stop the etching process. Waste water is drained out from the drain opening 38. Then, the vacuum pump stops pumping out air from the annular recesses 24, 25, and the annular recesses 24, 25 are brought back to the atmospheric pressure. Then, the lid 28 and the pot ring 21 removed. At this stage, the etched silicon wafer 1 has the cross-sectional structure shown in FIG. 1C.

In the proposed method, as described above, a wafer is thinned with a grindstone, which has a diameter smaller than that of the wafer, so the thinned area needs to be circular to provide the maximum number of chips. As a result, the dimension of the thinned area is limited by the orientation flat of the wafer. In contrast, with the etching system of FIG. 9, the rim 10 is formed by masking the periphery of the back surface 1b with the gasket 9 against the etchant 7 when the wafer 1 is etched from the back surface 1b. Therefore, it is possible to form the rim 10 to conform to the outline of the wafer 1. That is, as shown in FIG. 7A, the rim 10 can be formed to become linear at the orientation flat of the wafer 1 and arc-like at the rest of the periphery of the wafer 1. Thus, with the etching system of FIG. 9, the dimension of a wafer is more efficiently used in comparison with the proposed method.

Although the thickness of the wafer 1 is as thin as 100 µm at the recess 11, the wafer 1 has the rim 10, at which the wafer is as thick as 250 µm, at its periphery. Therefore, the wafer 1 is prevented from breaking or warping. As a result, it is possible to use a wafer with a relatively large diameter to manufacture a semiconductor power device using the etching system of FIG. 9. In addition, the cycle time of the grinding step shown in FIG. 2 is generally shorter than that of the etching step shown in FIG. 4, so the combination of the grinding step and the etching step shortens the manufacturing process of the semiconductor chips 15 in comparison with the case that the etching step is used alone.

As shown in FIG. 4, the wafer 1 is placed at a predetermined position in the etching pot 8 with the adhesive tape 4 stuck on the front surface 1a. Therefore, even if the bottom of the recess 11 reaches the cutting grooves 6 and the wafer 1 breaks during the etching step, the wafer 1 is prevented from separating apart because the wafer 1 is supported by the adhesive tape 4.

As shown in FIG. 10, the progress of etching is monitored to detect the etching end point using the thickness sensor 39, so the wafer 1 can be etched more accurate than in the case that the etching end point is determined on the basis of the etching rate.

Figure 11:
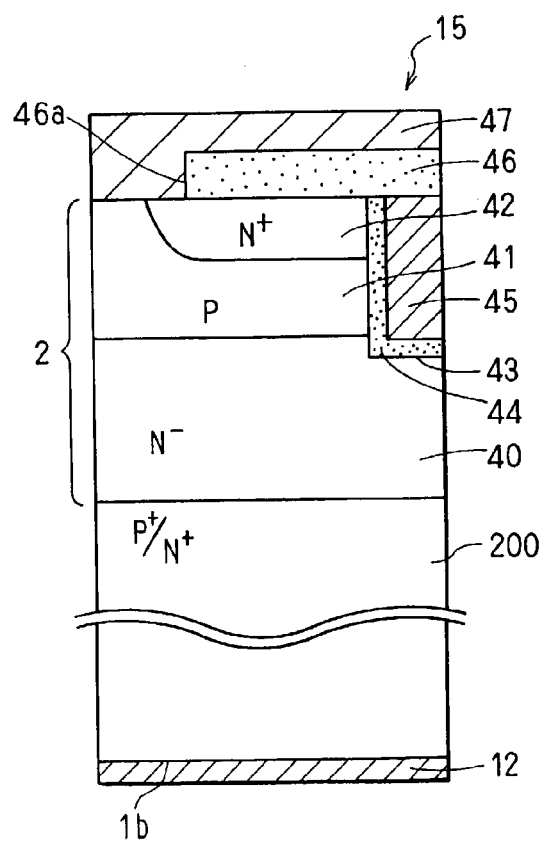
FIG. 11 is a partial enlarged view of a semiconductor power device according to the first embodiment.

As shown in FIG. 11, each semiconductor chip 15, which is a vertical type power device, includes a semiconductor element layer 2. The semiconductor element layer 2 is located on a surface of a semiconductor layer 200, which is $n^+$-type or $p^+$-type. Each semiconductor element layer 2 includes an $n^-$-type drift layer 40, which is formed by epitaxial growth on the surface of the semiconductor layer 200. In a surface of the $n^-$-type drift layer 40, a p-type base layer 41 is located. In a surface of the p-type base layer 41, an $n^+$-type source region 42 is located. Each semiconductor chip 15 has a trench 43 extends vertically from a surface of the source region 42 to the drift layer 40 through the source region 42 and the base layer 41, as viewed in FIG. 11. A gate-insulating film 44 is located on the surface defining the trench 43. A gate electrode 45 made of doped poly crystalline silicon is located on the gate-insulating film 44 in the trench 43.

The gate electrode 45, the base layer 41, and the source region 42 are covered by an interlayer insulating film 46, which is made of boron phosphorus silicate glass (BPSG). Through a contact hole 46a made in the interlayer insulating film 46, a source electrode 47 is in electric contact with the base layer 41 and the source region 42. Although not illustrated, a gate metal film, which is in electric contact with the gate electrode 45, and a surface protecting film, which is made of polyimide resin, are located in the front surface 1a. The drain electrode 12 is located on the back surface 1b. The drain electrode 12 is formed after the step of etching in FIG. 1C.

The wafer 1 becomes much thicker at the rim 10 than at the bottom of the recess 11 in the etching method shown in FIG. 4, so the wafer 1 is prevented from warping or breaking when the wafer 1 is thinned. Therefore, using the etching method shown in FIG. 4, it is possible to make a wafer drastically thin while the wafer is prevented from breaking or warping at the steps after etching. Moreover, the otherwise high contact resistance between the semiconductor layer 200 and the drain electrode 12 is reduced by thinning the wafer 1 using the etching method shown in FIG. 4, as explained below. As a result, it is possible to provide a vertical type power device that has drastically low ON resistance.

Figure 12:
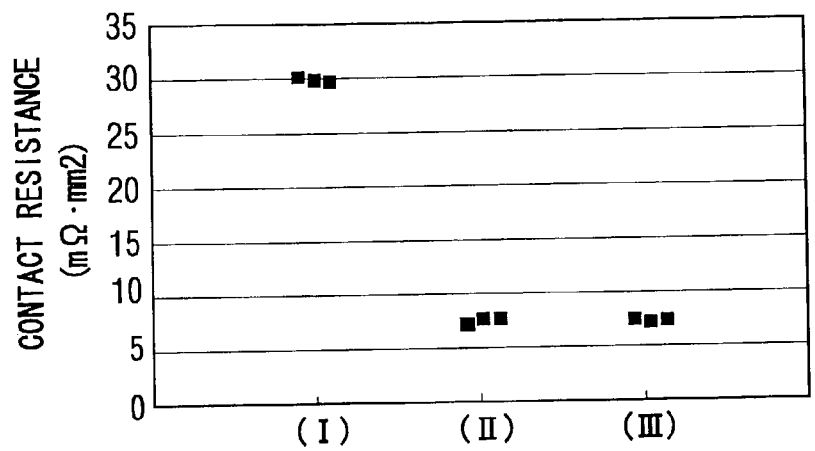
FIG. 12 is a graph showing the correlation between the contact resistance, which is the resistance between the back surface of a semiconductor wafer and an electrode formed on the back surface, and the thinning methods of the wafer.

As shown in FIG. 12, the contact resistance between a semiconductor layer and a drain electrode depends on the thinning method of a wafer. For the measurement of the contact resistances in FIG. 12, n-type wafers having a resistivity of 0.001 to 0.006 Ω·cm were used as the semiconductor layer, and titan (Ti) was formed as the drain electrode. The thinning methods used were: (I) only grinding, (II) grinding and etching with an etchant including hydrofluoric acid and nitric acid after the grinding, and (III) grinding and etching with an etchant including hydrofluoric acid, nitric acid, and sulfuric acid after the grinding.

As shown in FIG. 12, the method (I) that includes only grinding provides contact resistance much higher than the methods (II), (III) that include etching. When a semiconductor wafer is grinded, a damaged layer, which is made of amorphous silicon and has a thickness of hundreds of nanometers, is formed on the grinded surface. That is, the crystal lattice of the wafer is destroyed in the damaged layer, so current flow is obstructed by the damaged layer at the interface between a semiconductor layer and a drain electrode. Therefore, the contact resistance between the semiconductor layer and the drain electrode increases in the method (I) that includes only etching. On the other hand, the damaged layer is eliminated by etching in the methods (II), (III) that include etching, so the drain electrode is formed on crystal silicon without a damaged layer. Therefore, the contact resistance between the semiconductor layer and the drain electrode is reduced by combing the grinding and the etching.

Moreover, when a semiconductor wafer is ground using a grindstone having a roughness of #2000, the roughness Ra of the ground surface becomes approximately 10 nm. In contrast, when a semiconductor wafer is etched using the etchant including hydrofluoric acid, nitric acid, and sulfuric acid, the roughness Ra of the etched surface becomes approximately 150 nm. That is, the roughness Ra can be increased by combining the etching with the grinding. As the roughness Ra increases, the actual contact area between the semiconductor layer and the drain electrode is enlarged. Therefore, the adhesion between the semiconductor layer and the drain electrode is simultaneously increased by combining the etching with the grinding.

Incidentally, the pot etching system shown in FIG. 9, which includes the etching pot 8, is not necessarily used for etching the wafer 1 to form the rim 10 at its periphery. Instead of the pot etching system shown in FIG. 9, other etching systems such as a spin etching system may be used as long as the etching systems is capable of etching the wafer 1 to form the rim 10 at its periphery.

Second Embodiment

Figure 13:
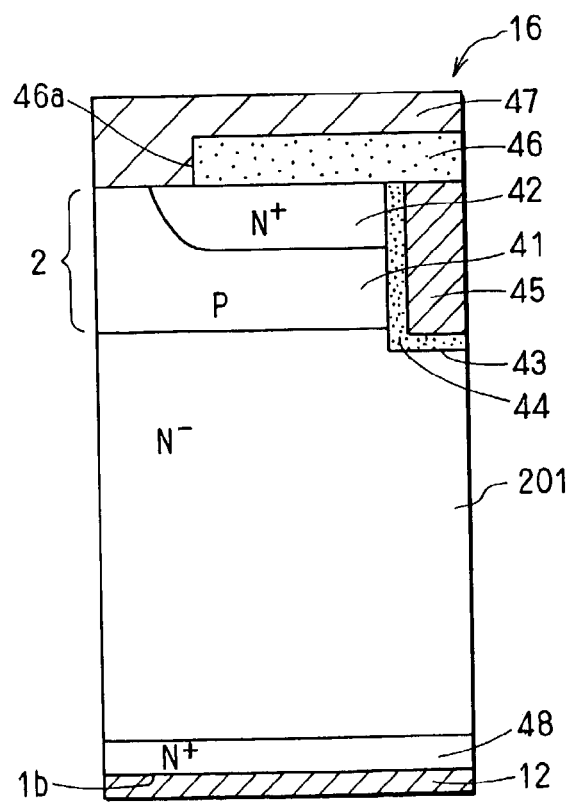
FIG. 13 is a partial enlarged view of a semiconductor power device according to the second embodiment.

A semiconductor chip 16 of FIG. 13 is a vertical type power device and different from the semiconductor chip 15 of FIG. 11 in the following aspects. The semiconductor layer 200 of FIG. 11 has a relatively high impurity concentration. On the other hand, a semiconductor layer 201 of FIG. 13 is n⁻-type and has a relatively low impurity concentration. Although not illustrated, the semiconductor layer 201 of FIG. 13 is formed using Czochralski (CZ) method. In the back surface 1b of the semiconductor layer 201 of FIG. 13, a high impurity concentration layer 48, or an n⁺-type drift layer 48, which has an impurity concentration higher than the semiconductor layer 201, is located.

The semiconductor chip 16 of FIG. 13 is formed in the same manner as the semiconductor chip 15 of FIG. 11 except for the n⁺-type drift layer 48. At first, a semiconductor wafer 1 is prepared. The wafer 1 includes a semiconductor layer 201, which is n⁻-type and formed using CZ method, and a semiconductor element layer 2, which is located on the semiconductor layer 201. The wafer 1 has a front surface 1a, at the side of which the semiconductor element layer 2 is located, and a back surface 1b, which is opposite to the front surface 1a and at the side of which the semiconductor layer 201 is located. Then, in the same manner as shown in FIG. 2, the wafer 1 is ground with a grindstone 3 from the back surface 1b. Then, in the same manner as shown in FIG. 3, an adhesive tape 13 is stuck on the back surface 1b, and a plurality of cutting grooves 6, each of which has a predetermined depth from the front surface 1a, are formed in the element layer 2 using a cutter 5.

Next, in the same manner as shown in FIG. 4, an adhesive tape 4 is stuck on the front surface 1a, and the wafer 1 is placed at a predetermined position in an etching pot 8 such that the back surface 1b is exposed to an etchant 7 during the etching of the wafer 1 except for the periphery of the back surface 1b, which is masked by a gasket 9. Then, the wafer 1 is etched from the back surface 1b by the etchant 7 to form a rim 10 at the periphery of the wafer 1 where the wafer 1 is masked during the etching. With the eching, a recess 11, which is defined by the rim 10, is formed in the wafer 1.

Then, as shown in FIG. 13, an n⁺-type drift layer 48, which has a relatively high impurity concentration, is formed in the back surface 1b. Subsequently, a drain electrode 12 is formed on the entire back surface 1b by depositing a metal using vacuum evaporation, sputtering, CVD, and so on. Then, as shown in FIG. 5, the wafer 1 and the adhesive tape 4 located on the front surface 1a are supported such that the front surface 1a faces downward, and the wafer 1 is pressed by a break roller 14 to bend. With the bending deformation, the wafer 1 breaks along the cutting grooves 6 and separates into a plurality of semiconductor devices 16, or semiconductor chips 16. Finally, as shown in FIG. 6, each chip 16 is picked up from the adhesive tape 4 and mounted at a predetermined place.

In the manufacturing process of the semiconductor chip 16 of FIG. 13, a p-type base layer 41 is directly formed using epitaxial growth on the semiconductor layer 201, which is n⁻-type and has a relatively low impurity concentration. In contrast, in the manufacturing process of the semiconductor chip 15 of FIG. 11, the n⁻-type drift layer 40 and the p-type base layer 41 are formed using epitaxial growth on the semiconductor layer 200. Therefore, the manufacturing cost of the semiconductor chip 16 of FIG. 13 is lower than that of the semiconductor chip 15 of FIG. 11. Moreover, in the semiconductor chip 16 of FIG. 13, the n⁺-type drift layer 48, which has a relatively high impurity concentration, is located between the semiconductor layer 201, which has a relatively low impurity concentration, and the drain electrode 12. Therefore, otherwise high contact resistance between the n⁻-type wafer 201 and the drain electrode 12 is reduced by the n⁺-type drift layer 48.

If the n⁺-type drift layer 48 was formed on the back surface 1b of the wafer 1 after the grinding without the etching, a damaged layer, which is generated in the back surface 1b when the wafer 1 is grinded, would lower the mobility of the carriers in the n⁺-type drift layer 48. As a result, the contact resistance between the $n^+$-type drift layer 48 and the drain electrode 12 would become relatively high, although the $n^+$-type drift layer 48 reduces the otherwise high contact resistance between the wafer layer 201 and the drain electrode 12.

However, the wafer 1 is thinned by etching in the same manner as in the step of FIG. 4. Therefore, the damaged layer in the back surface 1b is eliminated by the etching, and the $n^+$-type drift layer 48 has relatively high quality. As a result, the otherwise high contact resistance between the wafer layer 201 and the drain electrode 12 is effectively reduced by the $n^+$-type drift layer 48.

In the etching of the back surface 1b before the formation of the $n^+$-type drift layer 48, it is preferred that the back surface 1b be etched to have small surface roughness enough to be a mirror surface. The reason is that the $n^+$-type drift layer 48 is formed to be homogeneous in impurity concentration and the contact resistance between the $n^+$-type drift layer 48 and the drain electrode 12 becomes homogeneous if the impurity is implanted and diffused into the back surface 1b that is a mirror surface. The back surface 1b can be etched to become a mirror surface using an etchant that includes nitric acid, hydrofluoric acid, sulfuric acid, and phosphoric acid.

The above methods for manufacturing the semiconductor chips 15, 16 of FIGS. 11 and 13 may be modified as follows.

Figure 14:
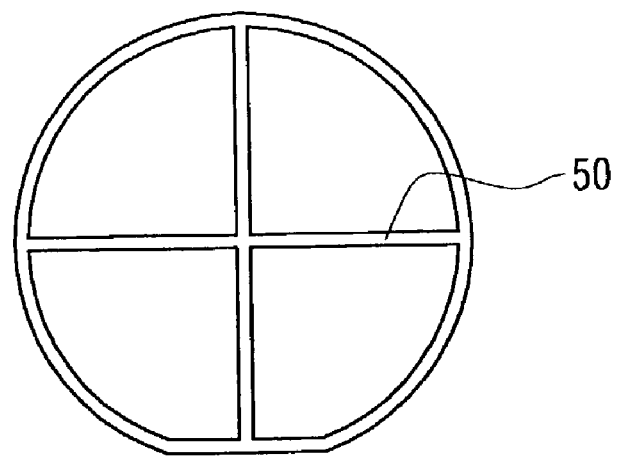
FIG. 14 is a plan view of a semiconductor wafer having beams in its central area in addition to a rim in its periphery.
Figure 15:
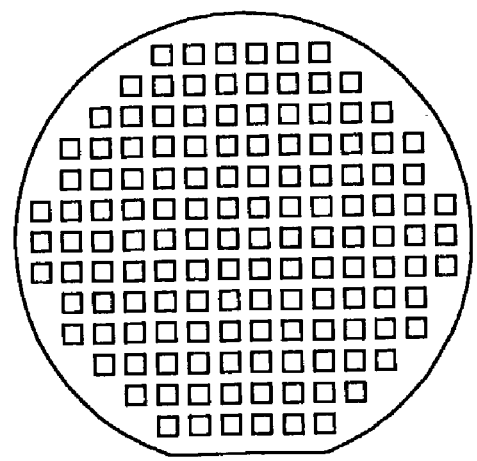
FIG. 15 is a plan view of a semiconductor wafer having grid-like beams.

In the above methods, when each wafer 1 is etched in the etching pot 8, each back surface 1b is masked by the gasket 9 except for the periphery of each back surface 1b such that each wafer 1 has a rim 10 and a recess 11, as shown in FIG. 1C. However, each back surface 1b may be masked in other shapes using a gasket and a known masking material. For example, as shown in FIG. 14, beams 50 can be formed in each recess 11 by masking crosswise each back surface 1b. The thin bottom of each recess 11 is reinforced with the beams 50, so each wafer 1 is further prevented from warping or breaking by forming the beams 50 in addition to a rim 10. With the beams 50, it becomes more easy to enlarge the size of each wafer 1 to improve the productivity of the semiconductor chips 15, 16. The beams 50 can be formed in a shape of the grid, as shown in FIG. 15.

In the etching using the pot etching system shown in FIG. 9, the progress of etching is monitored to detect precisely the etching end point, as shown in FIG. 10. However, the etching end point can be determined on the basis of the etching rate of each wafer 1 if the requirement for the thickness of the chips 15, 16 allows.

In the grinding method shown in FIG. 2, each wafer 1 is thinned to 250 µm. However, the thickness is not limited to 250 µm, and each wafer 1 may be thinned to any thickness as long as each wafer 1 can escape warping or breaking when any force is imposed on each wafer 1 at the manufacturing steps of the chips 15, 16 including the grinding.

In the etching using the pot etching system shown in FIG. 9, each wafer 1 is etched to have a thickness of 100 µm at the bottom of the recess 11. However, each wafer 1 may be etched to any thickness as long as each wafer 1 can escape breaking when the wafer 1 is handled in the manufacturing steps, for example, when the wafer 1 is removed from the etching pot 8. However, the thickness is preferably smaller than 200 µm.

In the manufacturing process of the semiconductor chips 15, 16, the steps shown in FIGS. 2 and 3 are interchangeable in the order. That is, each wafer 1 may be ground with the grindstone 3 from the back surface 1b such that the wafer 1 has a predetermined thickness after the cutting grooves 6, each of which has a predetermined depth from the front surface 1a, are formed. In either order, each wafer 1 is evenly thinned by the grinding, so the wafer 1 can be readily further thinned by the etching using the pot etching system shown in FIG. 9.

In the method shown in FIG. 5, each wafer 1 breaks along the cutting grooves 6, which are formed using the cutter 5 as shown in FIG. 3, and separates into a plurality of semiconductor chips 15, 16 by pressing the wafer 1 using the break roller 14. However, each wafer 1 may be separated into a plurality of semiconductor chips 15, 16 using the cutter 5 shown in FIG. 3 instead of the break roller 14 shown in FIG. 5 without forming the cutting grooves 6 shown in FIG. 3. In that case, each wafer 1 may be separated into a plurality of semiconductor chips 15, 16 by cutting the wafer 1 from the front surface 1a using the cutter 5.

The semiconductor chips 15, 16 shown in FIGS. 11 and 13 are n channel MOSFET. However, the methods for manufacturing the semiconductor chips 15, 16 can be applied to a vertical bipolar transistor, a vertical IGBT, and so on.

Figure 16A:
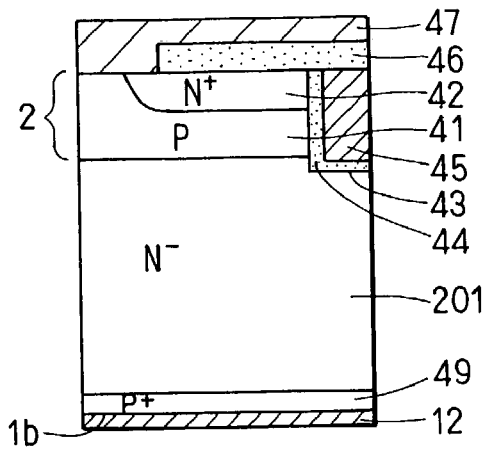
FIGS. 16A to 16C are partial cross-sectional views of modified versions of the semiconductor power device in FIG. 13.

In the manufacturing process of the semiconductor chip 16 of FIG. 13, the $n^+$-type drift layer 48 is formed in the back surface 1b of the wafer 1 to reduce the contact resistance between the semiconductor layer 201 and the drain electrode 12. However, the layer formed to reduce the contact resistance is not limited to the $n^+$-type drift layer 48. As shown in FIG. 16A, a $p^+$-type drain layer 49, which is $p^+$-type and has a high impurity concentration, may be formed to be located in the back surface 1b of the semiconductor layer 201 instead of the $n^+$-type drift layer 48.

Figure 16B:
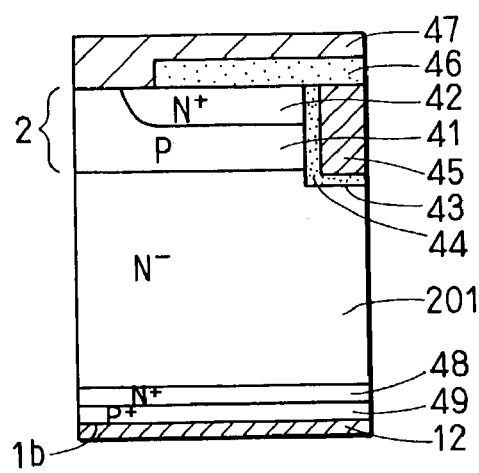
Figure 16C:
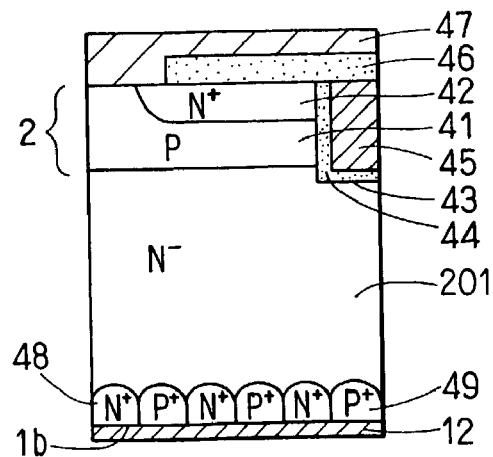

Alternatively, as shown in FIGS. 16B and 16C, the $n^+$-type drift layer 48 and the $p^+$-type drain layer 49 may be formed in combination. In FIG. 16B, the $n^+$-type drift layer 48 and the $p^+$-type drain layer 49 are layered. In FIG. 16C, the $n^+$-type drift layer 48 and the $p^+$-type drain layer 49 are located between the semiconductor layer 201 and the drain electrode 12.

In the manufacturing process of the semiconductor chip 16 of FIG. 13, a wafer that is manufactured using Czochralski (CZ) method is used. However, a wafer that is formed using floating zone (FZ) method may be used instead.

In the semiconductor chips 15, 16, each conductive type of the $n^-$-type drift layers 40, the p-type base layers 41, the $n^+$-type source regions 42, the semiconductor layers 200, 201, and the $n^+$-type drift layer 48 can be opposite.

In the manufacturing process of the semiconductor chip 15 of FIG. 11, the $n^-$-type drift layer 40 is formed on the semiconductor layer 200, which has a relatively high impurity concentration, by epitaxial growth. Instead, the layers 40, 200 may be formed by diffusing $n^+$-type or $p^+$-type impurity into an $n^-$-type wafer.

Third Embodiment

With respect to the etching method using the pot etching system shown in FIG. 9, JP-A-2000-124166 discloses a method for thinning a wafer to 5 to 100 µm using a pot etching system and KOH aqueous solution after preliminarily thinning the wafer to about 300 µm using a back surface grinding machine. Alternatively, JP-A-2000-91307 discloses a method for etching a silicon wafer using, for example, a 22 weight % aqueous solution of tetramethylammoniumhydroxide (TMAH).

In the etching method using the pot etching system shown in FIG. 9, the rim 10 is formed at each periphery of the wafers 1 of the first and second embodiments as shown in FIGS. 7A and 7B by masking the periphery with the gasket 9 during the etching. Therefore, although the thickness of each wafer 1 is as thin as 100 μm at the bottom of the recess 11, each wafer 1 is reinforced by the rim 10, at which each wafer 1 is as thick as 250 μm, at its periphery. Thus, the wafers 1 are prevented from breaking or warping. However, the wafers 1 are further assuredly prevented from breaking during the machining steps shown in FIGS. 17A to 17F.

For example, a trench-gate type vertical power MOSFET 15 in FIG. 11 is manufactured using the steps shown in FIGS. 17A to 17F, as follows. As shown FIG. 17A, a semiconductor wafer 101, which has a thickness of 625 μm and includes a plurality of semiconductor element regions 210 and a semiconductor layer 200, is formed using known semiconductor manufacturing methods. The wafer 101 has a front surface 1a and a back surface 1b, which is opposite to the front surface 1a. Specifically, each region is formed as follows. Firstly, an n$^-$-type drift layer 40 and a p-type base layer 41 are formed by epitaxial growth on the surface of the semiconductor layer 200. Then, an n$^+$-type source region 42 is formed in a surface of the p-type base layer 41 of each region 210.

A trench 43 is formed to extend vertically from a front surface of the source region 42 to the drift layer 40 through the source region 42 and the base layer 41. Then, a gate-insulating film 44 is formed on the surface defining the trench 43, and a gate electrode 45 made of doped poly crystalline silicon is formed on the gate-insulating film 44 in the trench 43. An interlayer insulating film 46 is formed, and a contact hole 46a is formed in the interlayer insulating film 46.

Figure 17A:
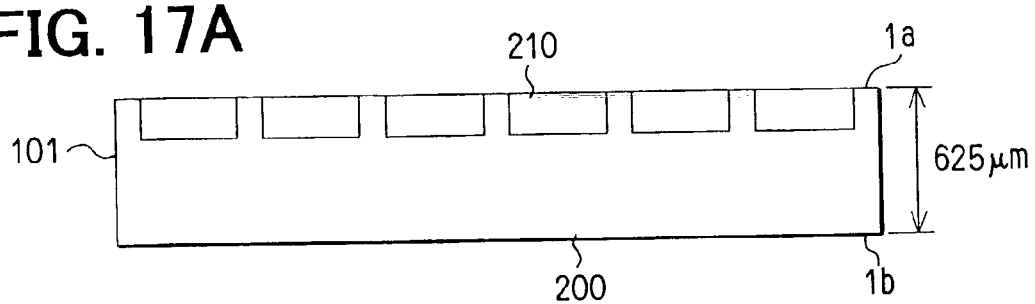
FIGS. 17A to 17F are schematic cross-sectional views showing a manufacturing process of a semiconductor power device using the method according to the third embodiment of the present invention.
Figure 17B:
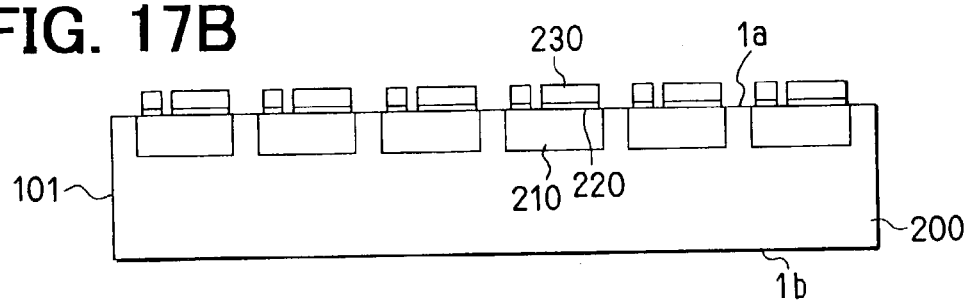

Then, as shown in FIG. 17B, a source electrode 47, which includes a Ti/TiN film 220 as a barrier metal, which includes a titan film and a titan nitride film, and a reinforcing film 230, or an aluminum alloy film 230, is formed on each region 210 as follows. Firstly, a titan layer and a titan nitride layer are formed by sputtering to have a total thickness of 300 nm. Then, an aluminum alloy layer having a thickness of 5 μm is formed on the titan nitride layer. For example, an alloy including aluminum and silicon and another alloy including aluminum, silicon, and copper may be used as the aluminum alloy film 230. Next, each Ti/TiN film 220 and each aluminum alloy film 230 are simultaneously patterned out of the titan, titan nitride, and aluminum alloy layers using photolithography and etching. Then, each Ti/TiN film 220 and each aluminum alloy film 230 are sintered at about 450° C. in a reducing atmosphere.

Figure 17C:
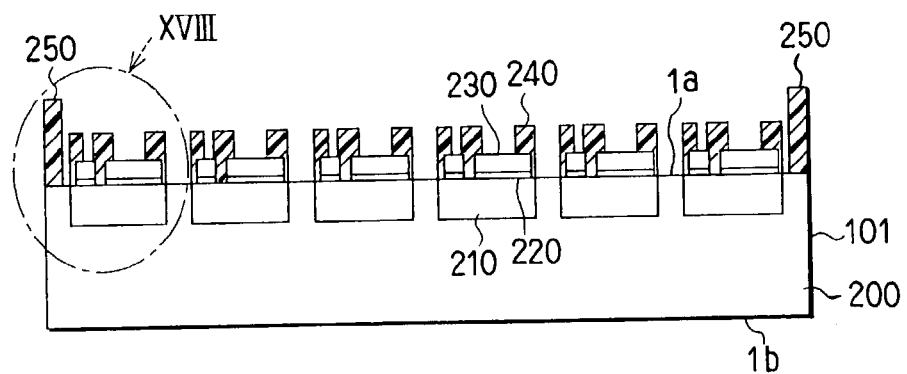

Subsequently, as shown in FIG. 17C, another reinforcing film 240, or a polyimide film 240, which also functions as a passivation film, is formed on each source electrode 47 as follows. Firstly, a polyimide layer having a thickness of 10 μm is formed by coating liquid polyimide using a spin coater. Then, the polyimide layer is patterned using photolithography and etching. Then, each polyimide film 240 is completed by curing the patterned polyimide layer at about 350° C. to fully imidize the patterned polyimide layer. As described later, the wafer 101 is reinforced by the aluminum alloy film 230 having a thickness of 5 μm and the polyimide film 240 having a thickness of 10 μm.

Figure 18:
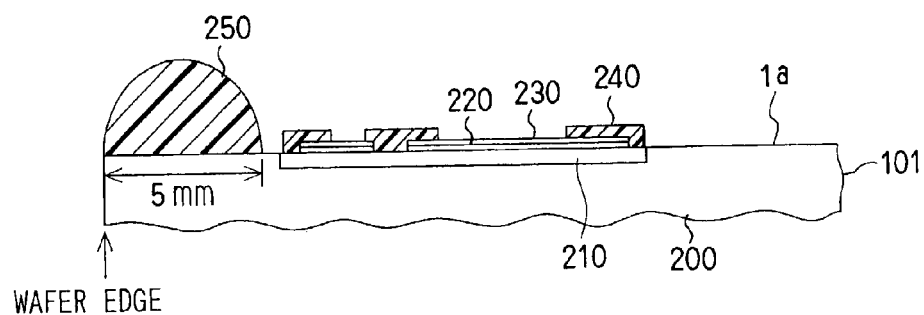
FIG. 18 is a partially enlarged view of the cross-section in the circle XVIII in FIG. 17C FIGS. 19A to 19J are schematic cross-sectional views showing steps in the etching of a semiconductor wafer.

When the polyimide film 240 is formed, a stopper film 250, or a thick polyimide rim 250, is formed at the periphery of the wafer 101 around the regions 210 as follows. Firstly, as shown in FIG. 18, precured liquid polyimide is coated with a brush on the periphery in the area within 5 mm from the circumferential edge of the wafer 101. Then, the polyimide rim 250 is completed by curing the precured liquid polyimide at about 350° C. The polyimide rim 250 is thick enough to function as a stopper in the horizontal direction of the FIG. 18, as described later.

Figure 17D:
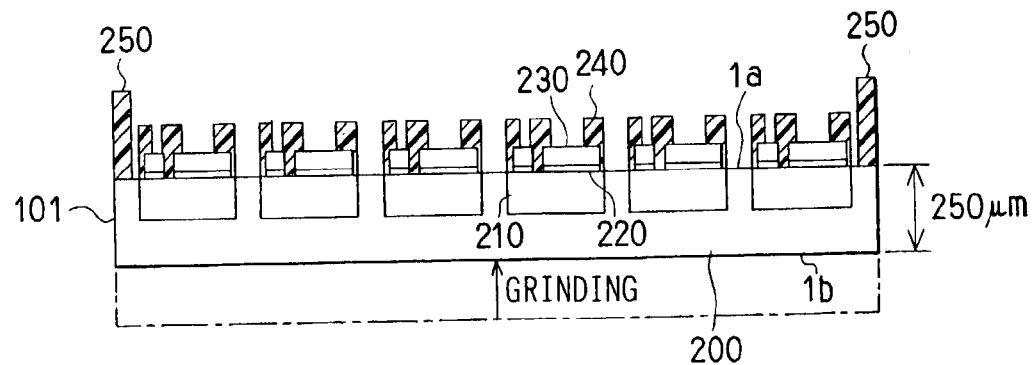

Then, as shown in FIG. 17D, the wafer 101, the semiconductor part 200, 210 of which has a thickness of 625 μm, is ground with a grinder from the back surface 1b such that the semiconductor part 200, 210 has a thickness of 250 μm. Before the grinding, the wafer 101 is plastered with a thick adhesive film on the front surface 1a for protecting the front surface 1a. The adhesive film is thick enough to prevent the wafer 101 from breaking due to the unevenness caused by the polyimide rim 250, which is located at the periphery of the wafer 101 on the front surface 1a, during the grinding.

Figure 17E:
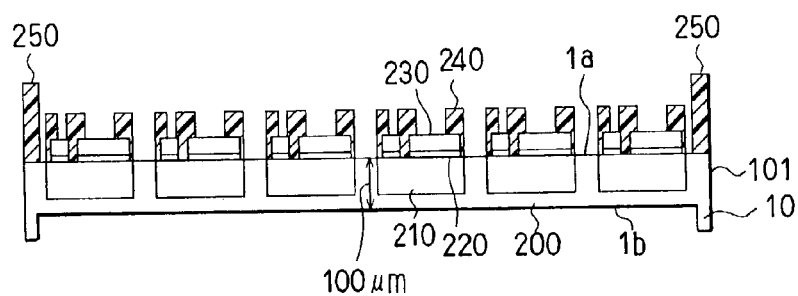
Figure 19A:
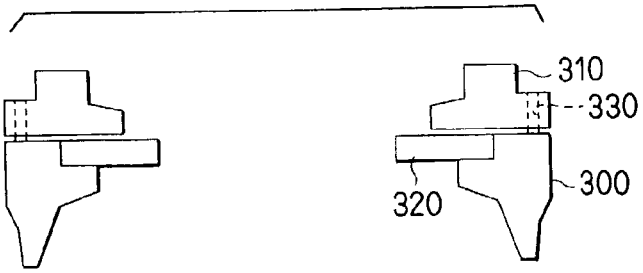

Next, as shown in FIG. 17E, the wafer 101 is etched from the back surface 1b until the thickness of the semiconductor part 200, 210 becomes 100 μm at the etched area, or until the semiconductor part 200, 210 is etched off by 150 μm. TMAH is used as an etchant. The steps for the etching will be explained in detail. At first, as shown in FIG. 19A, an annular gasket 320 is placed between a cylindrical first member 300 and an annular second member 310, and the first and second members 300, 310 are fastened together using external threads and corresponding internal threads 330, which are located in the second member 310, to clamp the gasket 320 between the members 300, 310.

Figure 19B:
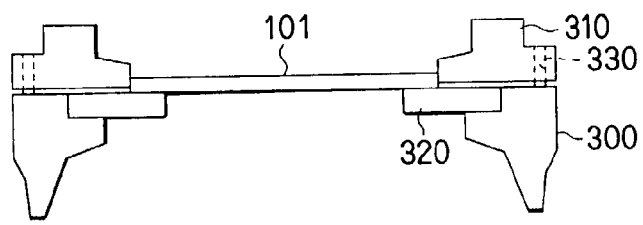
Figure 19C:
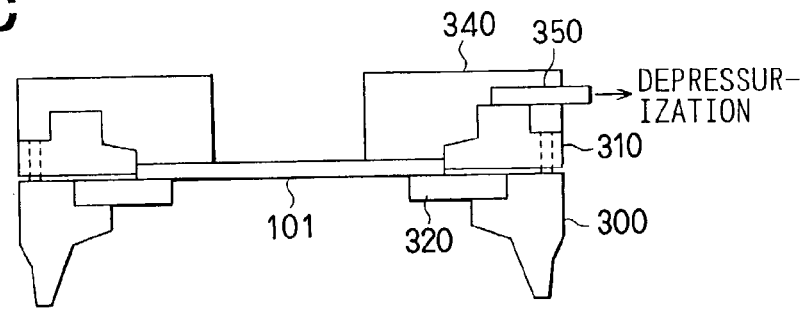

Then, as shown in FIG. 19B, the wafer 101 is placed on the gasket 320 such that the back surface 1b faces the gasket 320 at the periphery of the back surface 1b. Next, as shown in FIG. 19C, a third member 340 is attached to the second member 310 to fix the wafer 101 between the gasket 320 and the third member 340. Then, the space between the first and second members 300, 310 is depressurized through a depressurizing passage 350 such that the first and second members 300, 310 adhere to each other and the wafer 101 and the gasket 320 become in contact without a gap that can cause etchant leakage.

Figure 19D:
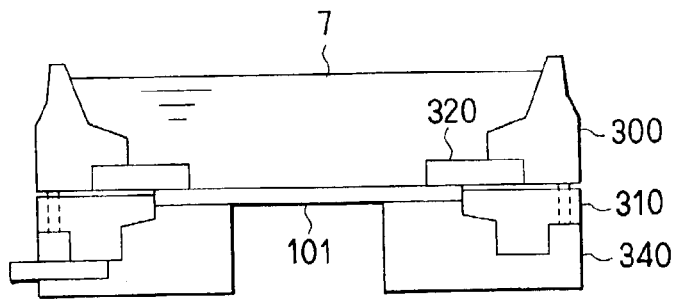
Figure 19E:
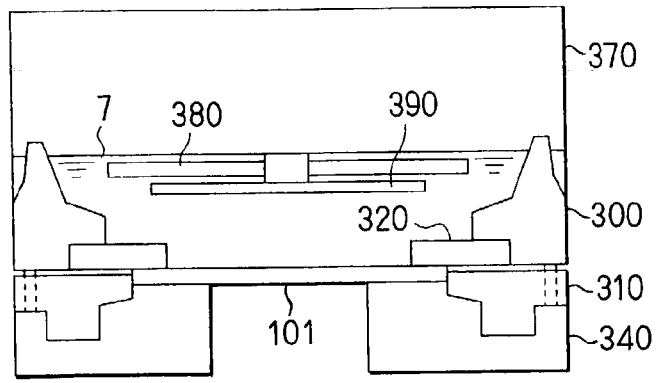
Figure 19F:
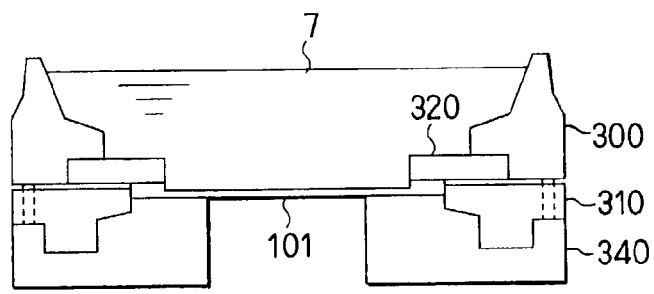
Figure 19G:
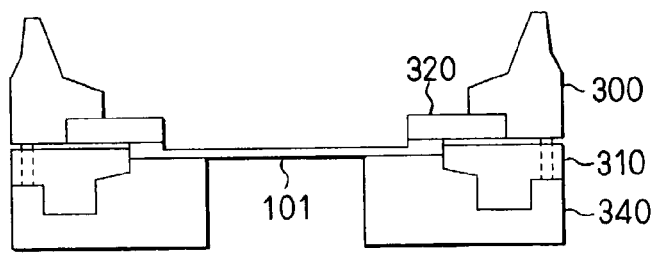
Figure 19H:
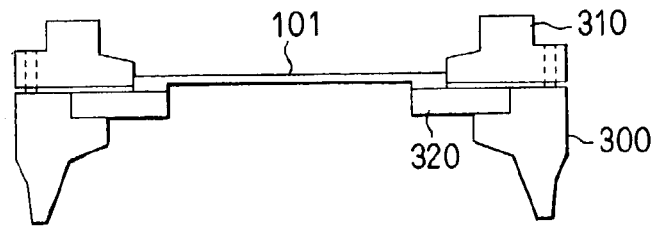

Subsequently, as shown in FIG. 19D, the assembly of FIG. 19C is turned upside down and filled with an etchant 360. Then, as shown in FIG. 19E, the assembly filled with the etchant 360 is covered with a fourth member 370. The fourth member 370 includes a heater 380 and a stirrer 390, and the etchant 360 is heated and stirred with the heater 380 and the stirrer 390 while the wafer 101 is etched. After a predetermined etching period, the fourth member 370 is dismantled from the assembly of FIG. 19E, as shown in FIG. 19F. The etchant 360 is drained out, as shown in FIG. 19G. Then, the assembly of FIG. 19G is turned upside down, and the third member 340 is dismantled from the assembly of FIG. 19G, as shown in FIG. 19H.

Figure 19I:
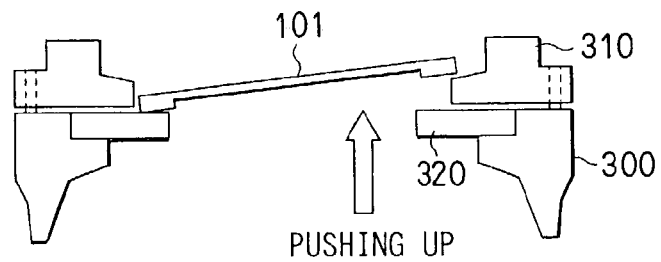
Figure 19J:
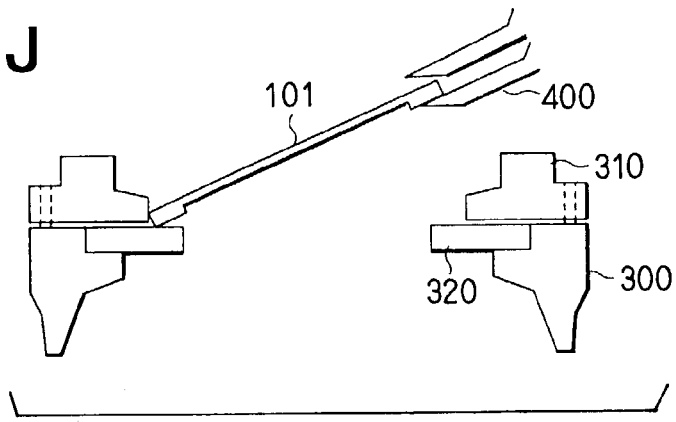

Next, as shown in FIG. 19I, the wafer 101 is partially, slightly pushed up from the back surface 1b. Then, as shown in FIG. 19J, the wafer 101 is pinched by a pair of tweezers at its periphery, where the wafer 101 is masked by the gasket 320 and relatively thicker, and picked up from the assembly of FIG. 19H. However, as shown in FIG. 20, if the polyimide rim 250 was not formed, the edge of the wafer 101 would readily intrude the gap between the first and second members 300, 310 and the wafer 101 would readily break when the wafer 101 was picked up.

Figure 21A:
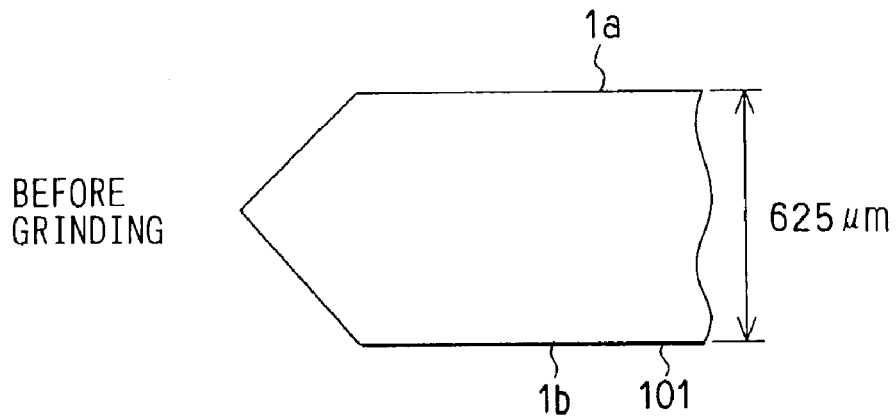
FIGS. 21A to 21C are schematic cross-sectional views respectively showing the shape of an end of a semiconductor wafer before grinding, after grinding, and after a polyimide rim is formed.

As shown in FIG. 21A, the wafer 101 originally has a beveled edge at its end, so the edge has a relatively large angle before the grinding step of FIG. 17D. Therefore, if the wafer 101 was etched without the grinding, the above problem would not be caused even if the polyimide rim 250 was not formed. However, in that case, the productivity decreases because the etching rate of the wafer 101 is as low as 0.8 μm/min even when a TMAH aqueous solution having a concentration of 22% is used as an etchant. Therefore, the grinding is practically inevitable from the standpoint of productivity.

Figure 20:
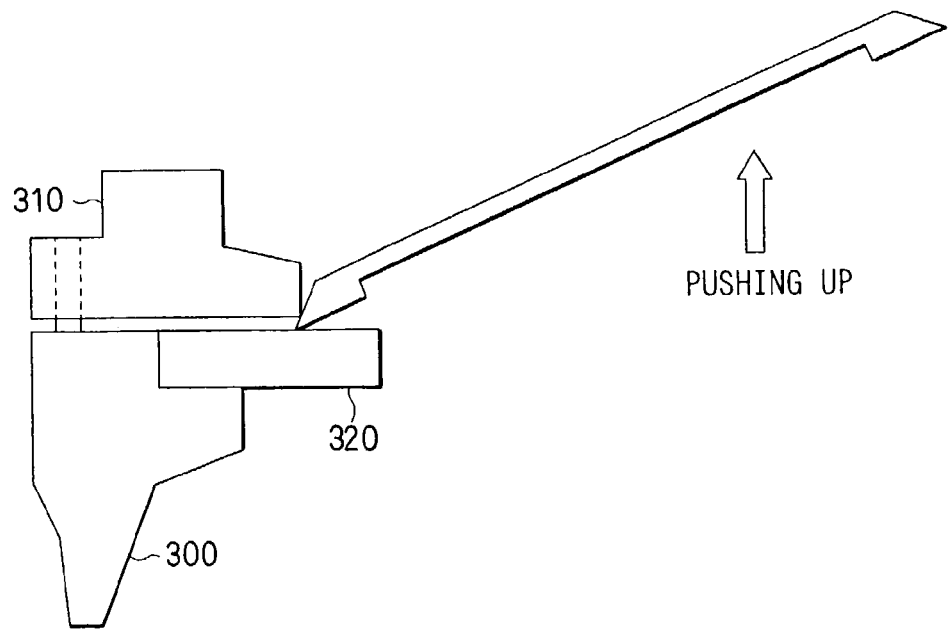
FIG. 20 is a schematic cross-sectional view showing a problem to be solved in the etching of a semiconductor wafer.
Figure 21B:
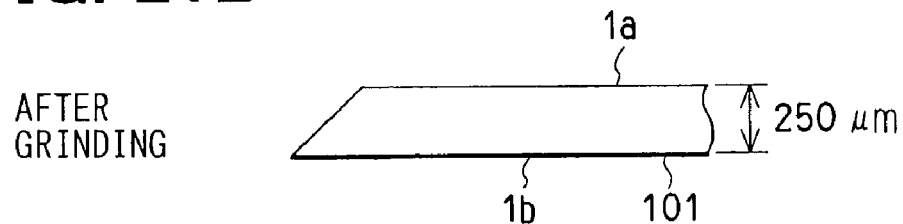
Figure 21C:
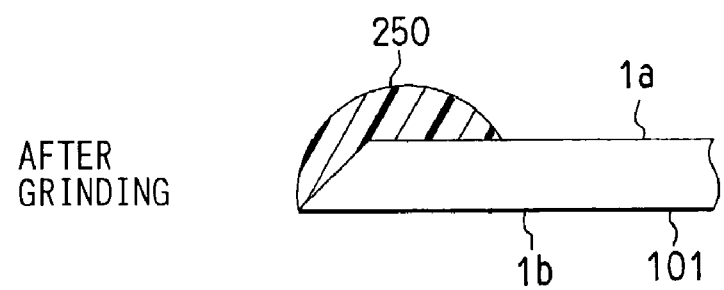
Figure 22:
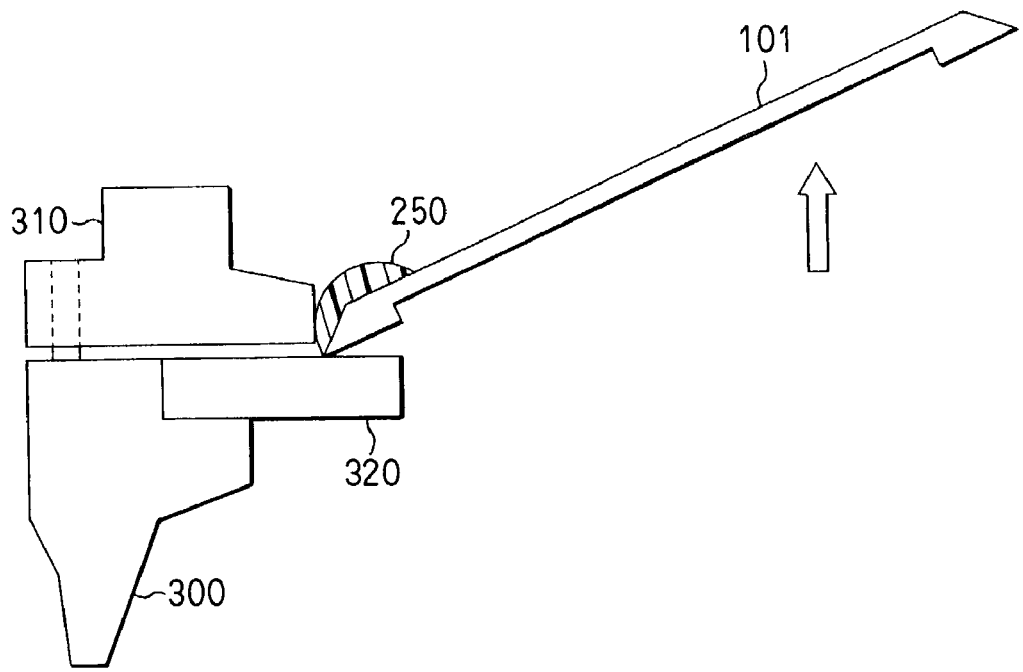
FIG. 22 a schematic cross-sectional view showing an effect of the method according to the third embodiment in the etching of a semiconductor wafer.

As shown in FIG. 21B, the edge of the wafer 101 would become sharpened after the grinding if the polyimide rim 250 was not formed, and the edge of the wafer 101 would readily intrude the gap between the first and second members 300, 310, as shown in FIG. 20. However, the polyimide rim 250 is formed at the periphery of the wafer 101 at the step of FIG. 17C, so the edge has a relatively large angle and the wafer 101 is relatively thick at its end after the grinding, as shown in FIG. 21C. Therefore, as shown in FIG. 22, the edge of the wafer 101 does not intrude the gap between the first and second members 300, 310 because the polyimide rim 250 functions as a stopper. Thus, the wafer 101 is prevented from breaking when the wafer 101 was picked up.

Figure 23:
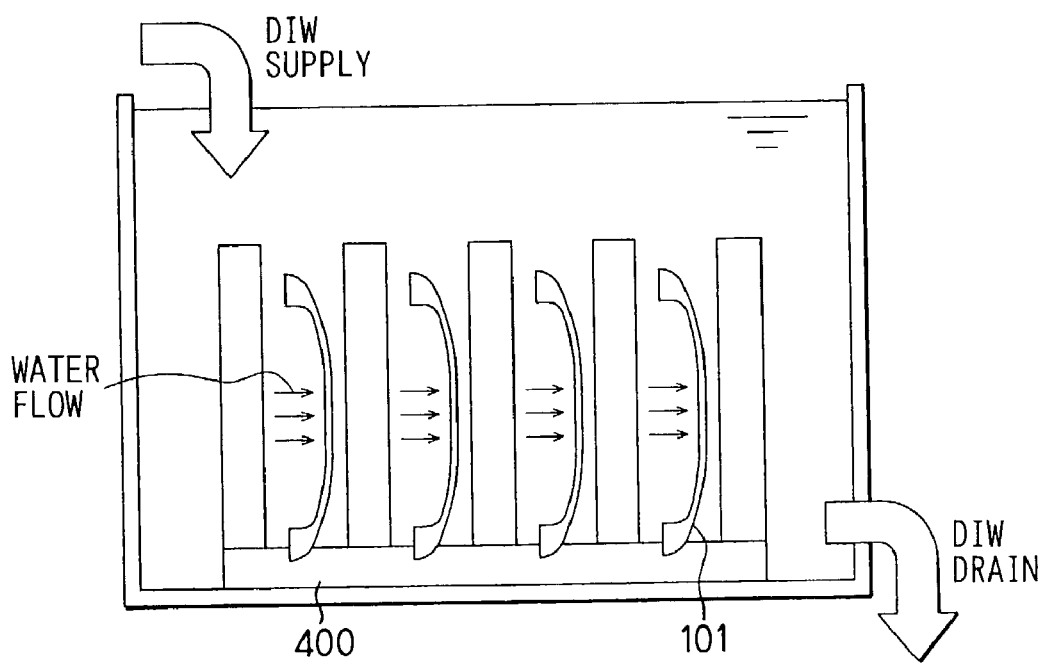
FIG. 23 is a schematic cross-sectional view showing a state that a semiconductor wafer is rinsed with deionized water after etching.

The wafer 101 is placed in a wafer carrier 400 after the wafer 101 is picked up as shown FIG. 19J, and the wafer 101 is rinsed with deionized water (DIW), as shown in FIG. 23. At that time, the wafer 101 is pressed and deformed by the flow of DIW. However, the wafer 101 is reinforced by the aluminum alloy film 230, which is elastic and has a thickness of 5 µm, and the polyimide film 240, which is elastic and has a thickness of 10 Am. Therefore, the wafer 101 is prevented from breaking when being deformed by the flow of DIW during the rinsing.

On the other hand, a trench-gate type vertical power MOSFET having a conventional metal electrode and a passivation film is manufactured using the manufacturing steps shown in FIGS. 24A to 24E. Firstly, as shown FIG. 24A, a semiconductor wafer 102, which has includes a plurality of semiconductor element regions 210 and a semiconductor layer 200, is formed. Then, a titan layer and a titan nitride layer are formed to have a total thickness of 300 nm, and an aluminum alloy layer having a thickness of 2 µm is formed on the titan nitride layer.

Figure 24A:
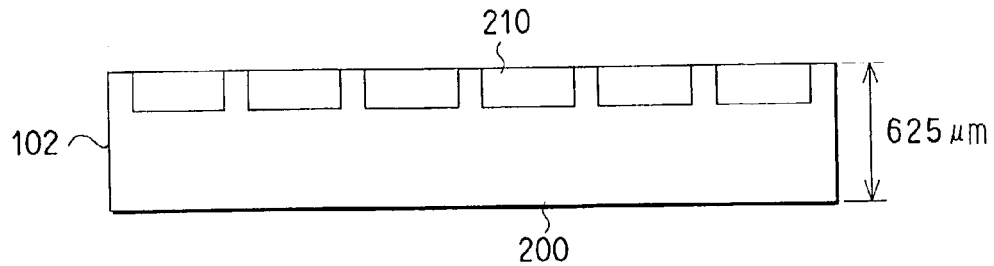
FIGS. 24A to 24E are schematic cross-sectional views showing a manufacturing process of a semiconductor power device having a conventional metal electrode and a passivation film.
Figure 24B:
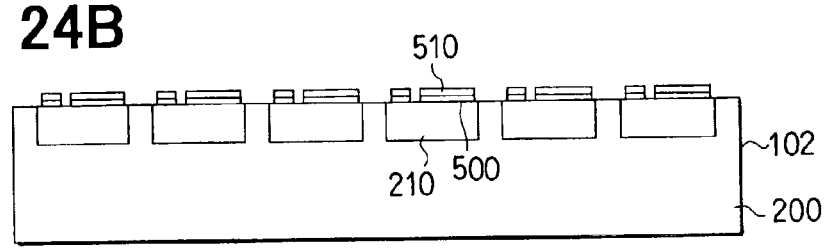
Figure 24C:
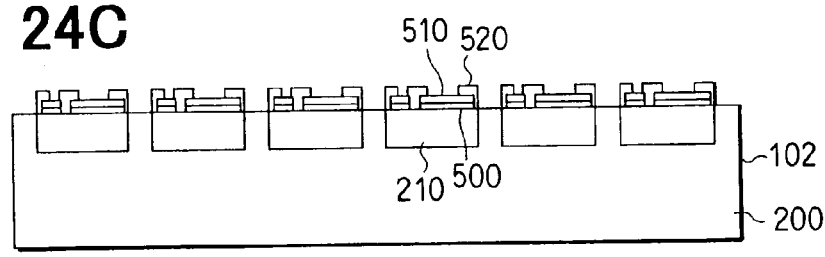
Figure 24D:
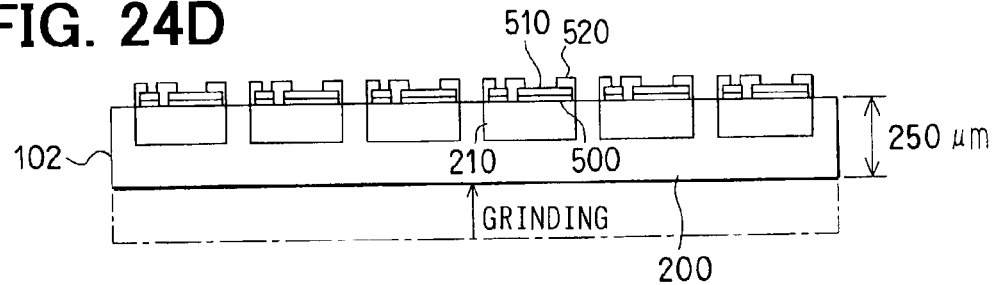

Next, as shown in FIG. 24B, each Ti/TiN film 500 and each aluminum alloy film 510 are simultaneously patterned out of the titan, titan nitride, and aluminum alloy layers using photolithography and etching. Then, each Ti/TiN film 500 and each aluminum alloy film 510 are sintered at about 450° C. in a reducing atmosphere. Then, a silicon nitride layer having a thickness of 1.5 µm is formed by CVD, and a passivation film 520, or a silicon nitride film 520, is patterned out of the silicon nitride layer on each aluminum alloy film 510 by using photolithography and etching, as shown in FIG. 24C. Then, as shown in FIGS. 24D and 24E, the wafer 102 is ground with a grinder and etched.

Figure 24E:
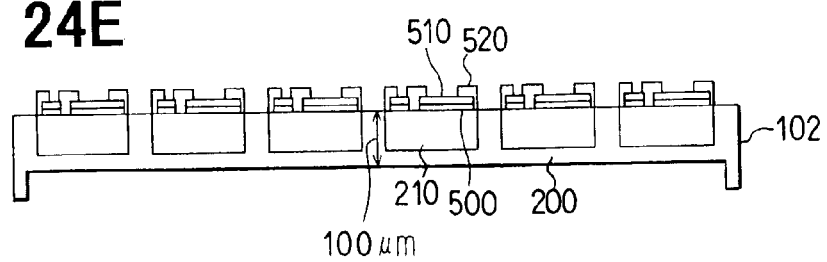

In comparison with the wafer 102 of FIG. 24E, the wafer 101 of FIG. 17E is reinforced by the aluminum alloy film 230, which is thicker than the aluminum alloy film 510, and the polyimide film 240. Therefore, the wafer 101 of FIG. 17E is less fragile than the wafer 102 of FIG. 24E.

The polyimide film 240 can be formed on the scribe lines between two semiconductor element regions 210 adjacent to each other. However, when the wafer 101 is diced, the diced chips tend to be pitted because the dicing saw blade clogs with the polyimide resin of the polyimide film 240. Therefore, in that case, the pitting needs to be addressed.

Figure 17F:
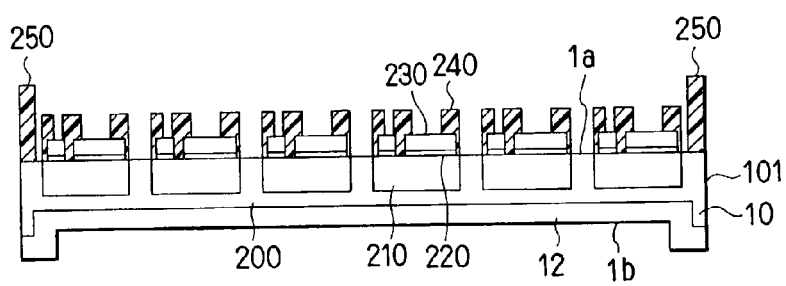

After the rinsing step shown in FIG. 23, the back surface 1b of the wafer 101 is cleansed by, for example, reverse sputtering. Then, as shown in FIG. 17F, a titan layer, a nickel layer, and a gold layer are deposited respectively to a predetermined thickness on the back surface 1b in this order to form a Ti/Ni/Au layer 12. A part of the Ti/Ni/Au layer 12 becomes a back surface electrode 12, or a drain electrode 12 of the device in FIG. 11. As shown in FIG. 17E, the wafer 101 has a rim 10 having a thickness of 250 µm at its periphery, so the wafer 101, the etched area of which is as thin as 100 µm, hardly warps.

As a result, the wafer 101 is prevented from coming out from the loading arm that carries the wafer 101 during the depositing step. Moreover, the wafer 101 is prevented from contacting another wafer 101 when the wafers 101 are loaded into a wafer carrier to be adjacent to each other. Moreover, the polyimide rim 250 does not harmfully affect when the wafer 101 is rinsed or when the Ti/Ni/Au layer 12 is formed.

After the deposition step shown in FIG. 17F, the wafer 101 is diced into individual chips 15 to complete thin power devices that are as thin as 100 µm.

Figure 25:
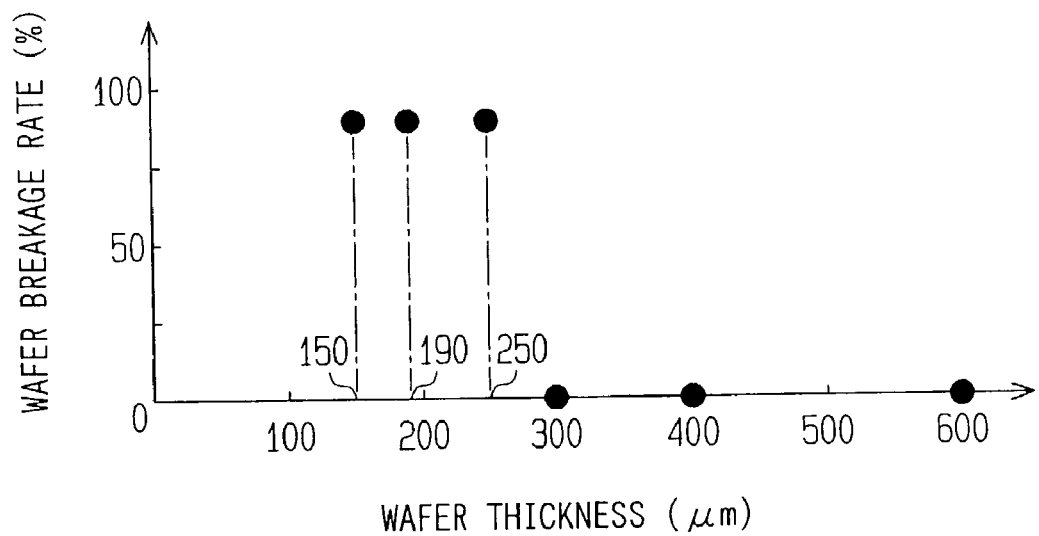
FIG. 25 is a graph showing the correlation between wafer breakage rate and wafer thickness.
Figure 26:
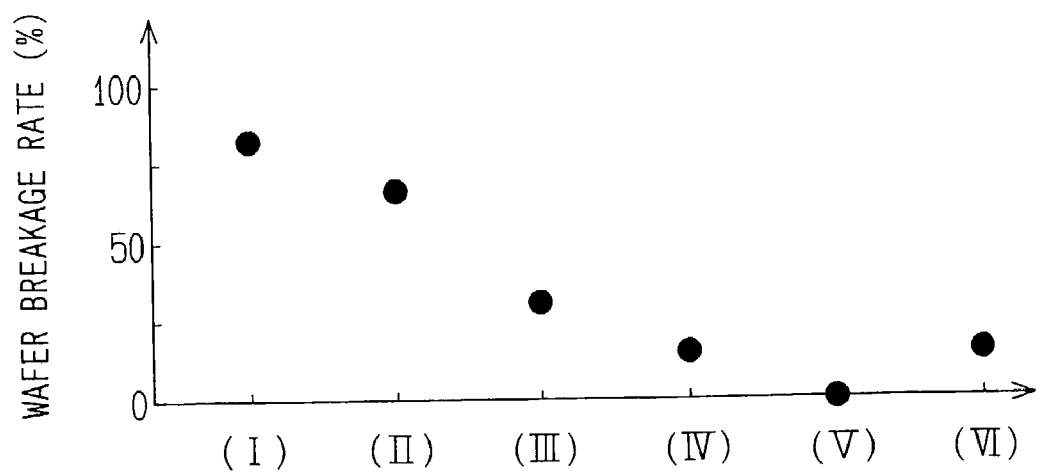
FIG. 26 is a graph showing the correlation between wafer breakage rate and combination of passivation film, polyimide rim, and aluminum alloy film.

As shown in FIG. 25, wafers thinner than 300 mm readily break. However, as shown in FIG. 26, the wafers can become less breakable using a reinforcing film or a stopper film. In FIG. 26, wafer breakage rates are shown for six combinations of the reinforcing film and the stopper film; (I) a silicon nitride film and an aluminum alloy film having respectively thicknesses of 1 µm and 900 nm without a polyimide rim, (II) a polyimide film and an aluminum alloy film having respectively thicknesses of 2 µm and 900 nm without a polyimide rim, (III) a polyimide film and an aluminum alloy film having respectively thicknesses of 2 µm and 5 µm without a polyimide rim, (IV) a polyimide film and an aluminum alloy film having respectively thicknesses of 10 µm and 5 µm without a polyimide rim, (V) a polyimide film and an aluminum alloy film having respectively thicknesses of 10 µm and 5 µm and a polyimide rim, and (VI) a polyimide film and an aluminum alloy film having respectively thicknesses of 10 µm and 900 nm and a polyimide rim.

Comparing the combination (I) with the combination (II), it is concluded that the polyimide film having a thickness of 2 µm can prevent wafers from breaking better than the silicon nitride film having a thickness of 1 µm. Comparing the combination (II) with the combination (III), it is concluded that wafers become less breakable as the aluminum alloy film becomes thicker. Comparing the combination (III) with the combination (IV), it is concluded that wafers become less breakable as the polyimide film becomes thicker. Comparing the combination (IV) with the combination (V), it is concluded that wafers become less breakable with the polyimide rim. Comparing the combination (V) with the combination (VI), it is concluded that wafers also become less breakable as the aluminum alloy film becomes thicker in combination with polyimide rim.

Figure 27A:
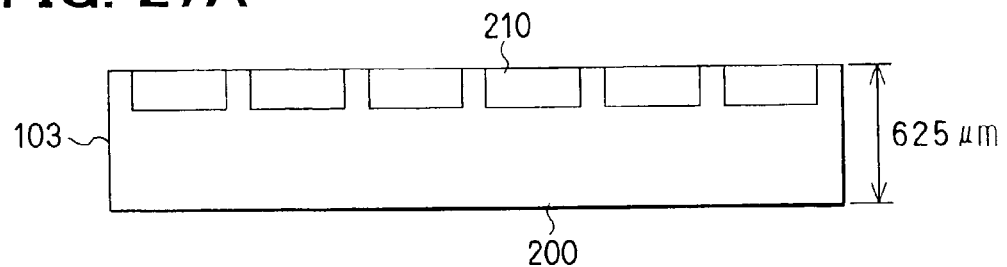
FIGS. 27A to 27F are schematic cross-sectional views showing another manufacturing process of a semiconductor power device using the method according to the third embodiment of the present invention.
Figure 27B:
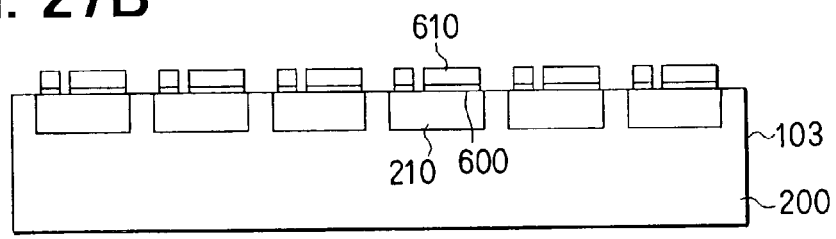

The manufacturing process shown by FIGS. 17A to 17F can be modified as shown in FIGS. 27A to 27F, in which any polyimide rim 250 is not formed and which respectively correspond to FIGS. 17A to 17F. Firstly, as shown FIG. 27A, a semiconductor wafer 103, which has includes a plurality of semiconductor element regions 210 and a semiconductor layer 200, is formed in the same manner as described for the step of FIG. 17A. Then, as shown in FIG. 27B, Ti/TiN films 600, which have a total thickness of 300 nm, and reinforcing films 610, or aluminum alloy films 610, which have a thickness of 5 µm, are formed in the same manner as described for the step of FIG. 17B.

Figure 27C:
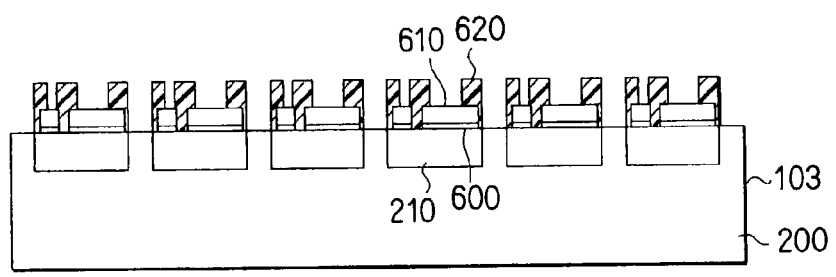
Figure 27D:
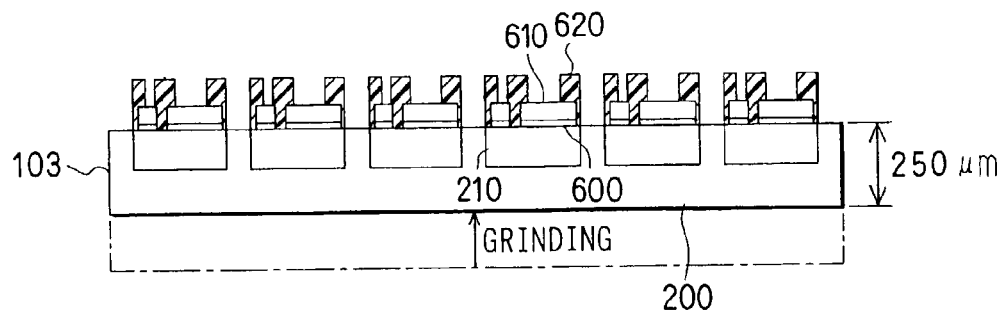
Figure 27E:
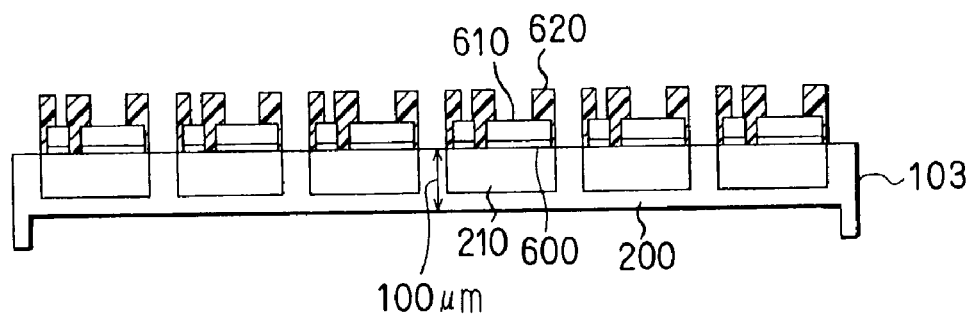
Figure 27F:
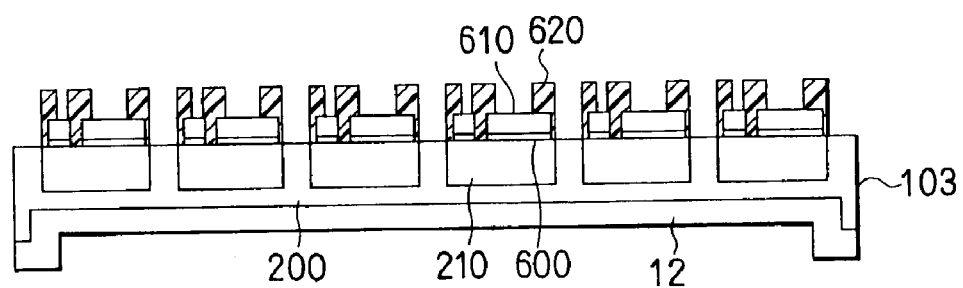

Subsequently, as shown in FIG. 27C, a reinforcing film 620, or a polyimide film 620, which also functions as a passivation film, is formed in the same manner as described for the polyimide film 240 of FIG. 17C. In the manufacturing process shown by FIGS. 27A to 27F, no thick polyimide rim 250 is formed at the periphery of the wafer 103 around the regions 210. In that aspect, the manufacturing process shown by FIGS. 27A to 27F is different from that shown by FIGS. 17A to 17F. Then, as shown in FIGS. 27D and 27E, the wafer 103 is ground with a grinder and eatched in the same manner as described for the steps of FIGS. 17D and 17E. Finally, as shown in FIG. 27F, a Ti/Ni/Au layer 12 is formed in the same manner as described for the step of FIG. 17F.

The manufacturing process shown by FIGS. 17A to 17F can be further modified as follows. At the step of FIG. 17B, the aluminum alloy film 230 having a thickness of 5 μm is formed on each region 210. However, the aluminum alloy film 230 may have a thickness greater than 5 μm. Instead of the aluminum alloy film 230, a film substantially made of pure aluminum may be used. At the step of FIG. 17C, the polyimide film 240 having a thickness of 10 μm is formed. However, the polyimide film 240 may have a thickness greater than 10 μm. In the manufacturing process shown by FIGS. 17A to 17F, both aluminum alloy film 230 and the polyimide film 240 are formed. However, only one of them may be formed. In addition, the polyimide rim 250 may be formed without forming the aluminum alloy film 230 and the polyimide film 240.

What is claimed is:

1. A method for manufacturing a semiconductor device, comprising the steps of:
    forming a semiconductor element on a semiconductor wafer which includes a semiconductor layer and a semiconductor element layer on the semiconductor layer, the semiconductor element being located at a side of the semiconductor element layer;
    back-grinding evenly the semiconductor wafer from a side of the semiconductor layer to thin the semiconductor wafer, whereby the semiconductor wafer has a first thickness and a roughened ground surface of a first roughness; and
    thinning the semiconductor wafer by wet etching from the roughened ground surface while masking a periphery of the semiconductor wafer where no semiconductor element is disposed, whereby the semiconductor wafer has a second thickness thinner than the first thickness and a rim corresponding to the periphery where masking is disposed,
    wherein the step of thinning includes steps of removing a damaged layer formed during the back-grinding and controlling a surface roughness after the wet etching to have a processed surface of a second roughness which is different from the first roughness.

2. The method in claim 1, further comprising a step of forming a metal on the processed surface.

3. The method in claim 2, further comprising a step, prior to the metal formation and after the step of thinning, of introducing dopants from the processed surface.

4. The method in claim 1, wherein an etchant during the wet etching process includes hydrofluoric acid and nitric acid.

5. The method in claim 1, wherein the second roughness is more rough than the first roughness.

6. The method in claim 5, wherein an etchant during the wet etching includes hydrofluoric acid, nitric acid and sulfuric acid.

7. The method in claim 1, wherein the second roughness is less rough than the first roughness.

8. The method in claim 7, wherein an etchant during the wet etching includes hydrofluoric acid, nitric acid, sulfuric acid and phosphoric acid.

9. The method in claim 1, wherein the first thickness is thicker than 200 microns.

10. The method in claim 9, wherein the second thickness is thinner than 200 microns.

11. The method in claim 1, wherein the second thickness is thinner than 200 microns.

* * * * *